(12) United States Patent
Schleicher

(10) Patent No.: US 10,230,336 B2
(45) Date of Patent: Mar. 12, 2019

(54) RF POWER DETECTOR CIRCUITS

(71) Applicant: Infineon Technologies AG, Neubiberg (DE)

(72) Inventor: Bernd Schleicher, Ebersberg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 4 days.

(21) Appl. No.: 15/359,543

(22) Filed: Nov. 22, 2016

(65) Prior Publication Data
US 2018/0145641 A1   May 24, 2018

(51) Int. Cl.
| H03F 3/04 | (2006.01) |
| H03F 1/30 | (2006.01) |
| H03F 3/195 | (2006.01) |
| G01R 21/10 | (2006.01) |
| H03F 1/02 | (2006.01) |

(52) U.S. Cl.
CPC ............. *H03F 1/302* (2013.01); *G01R 21/10* (2013.01); *H03F 1/0266* (2013.01); *H03F 3/195* (2013.01); *H03F 2200/105* (2013.01); *H03F 2200/165* (2013.01); *H03F 2200/18* (2013.01); *H03F 2200/387* (2013.01); *H03F 2200/451* (2013.01)

(58) Field of Classification Search
CPC ......... H03F 1/302; H03F 1/0222; H03F 3/195
USPC ....................................... 330/296, 285, 277
See application file for complete search history.

(56) References Cited

U.S. PATENT DOCUMENTS

| 4,866,396 A | 9/1989 | Tamura |
| 5,196,806 A | 3/1993 | Ichihara |
| 5,404,585 A | 4/1995 | Vimpari et al. |
| 5,434,537 A | 7/1995 | Kukkonen |
| 6,108,527 A | 8/2000 | Urban et al. |
| 6,392,492 B1 * | 5/2002 | Yuan ............ H03F 1/22 330/296 |
| 6,531,860 B1 | 3/2003 | Zhou et al. |
| 8,897,727 B2 | 11/2014 | Wang et al. |
| 9,281,786 B2 | 3/2016 | Kovac |
| 9,322,856 B2 | 4/2016 | Rabjohn et al. |
| 2015/0349812 A1 | 12/2015 | Whittaker |

* cited by examiner

*Primary Examiner* — Khanh V Nguyen
*Assistant Examiner* — Khiem Nguyen
(74) *Attorney, Agent, or Firm* — Slater Matsil, LLP

(57) ABSTRACT

A radio frequency (RF) power detector includes a first circuit having a first rectifying diode with a first terminal coupled to a first power supply voltage node. The first circuit also includes an input terminal coupled to a second terminal of the first rectifying diode, a first transistor having a first collector coupled to the second terminal of the first rectifying diode and a first emitter coupled to a reference voltage node, and a second transistor having a second emitter coupled to the reference voltage node and a second collector coupled to a second power supply voltage node. The first circuit further includes a low-pass filter network coupled between a first base of the first collector and a second base of the second transistor, and a first output terminal coupled to the second collector of the second transistor.

23 Claims, 19 Drawing Sheets

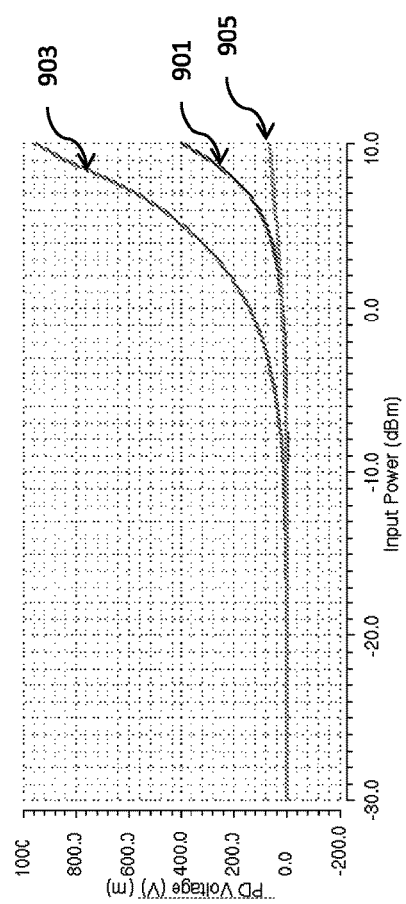
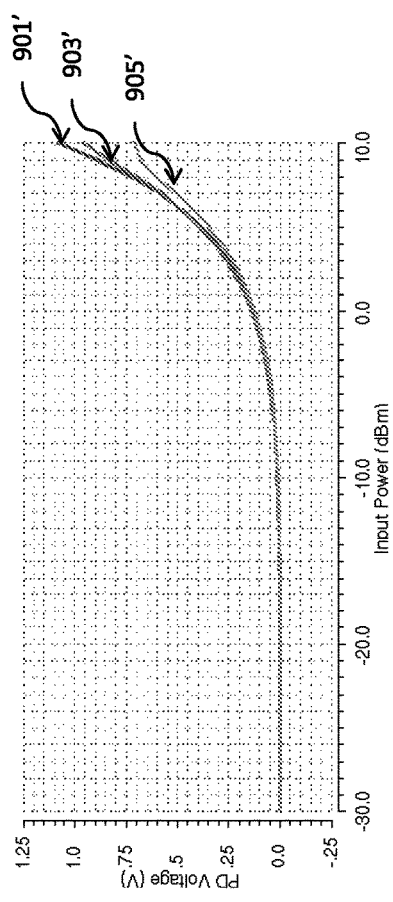
Fig. 9A
Fig. 9B

RF POWER DETECTOR CIRCUITS

TECHNICAL FIELD

The present disclosure relates generally to circuits, in particular to systems and methods for radio frequency (RF) power detector circuits.

BACKGROUND

RF power detectors circuits (also referred to as RF power detectors) are widely used in various applications involving RF signals. For example, in a RF transmitter, RF power detectors may be used to monitor the power of the RF output signal. Measurement from RF power detectors may be used in a feedback control loop to generate RF output signal at predetermined power levels. In an antenna array, measurements from RF power detectors at all of the antenna elements may be used to detect antenna mismatch, as another example. In addition, RF power detectors may also be used as part of a calibration circuit for calibration, or in production testing circuit to determine whether a device is defective.

Challenges abound in RF power detector circuit design. For example, when RF power detector is inserted or coupled to a certain location of a RF circuit to measure the power of the RF signal, impedance mismatch may cause signal reflections that reduces the transmission efficiency and cause distortions to the signals to be measured. Additionally, output of RF power detectors may be affected by various factors such as the temperature, thereby degrading the accuracy of the measurements. There is a need in the art for RF power detectors that offers good performance (e.g., sensitivity, impedance matching, and robustness against temperature) over a wide RF frequency band.

SUMMARY OF THE INVENTION

In accordance with an embodiment, a radio frequency (RF) power detector includes a first circuit having a first rectifying diode with a first terminal coupled to a first power supply voltage node. The first circuit also includes an input terminal coupled to a second terminal of the first rectifying diode, a first transistor having a first collector coupled to the second terminal of the first rectifying diode and a first emitter coupled to a reference voltage node, and a second transistor having a second emitter coupled to the reference voltage node and a second collector coupled to a second power supply voltage node. The first circuit further includes a low-pass filter network coupled between a first base of the first collector and a second base of the second transistor, and a first output terminal coupled to the second collector of the second transistor.

BRIEF DESCRIPTION OF THE DRAWINGS

For a more complete understanding of the present invention, and the advantages thereof, reference is now made to the following descriptions taken in conjunction with the accompanying drawings, in which:

FIGS. 9A and 9B illustrate the performance of an RF power detector in FIG. 4 with and without power supply voltage compensation for temperature drift, respectively, in some embodiments;

Corresponding numerals and symbols in different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, systems and methods for RF power detector circuits.

In accordance with an embodiment of the present disclosure, an RF power detector includes a diode coupled to an input of a current mirror via a resistor. The resistor provides broadband matching over a wide range of frequencies. For robust operation against temperature drift, a power supply circuit may be used to adjust an input voltage of the RF power detector circuit in accordance with the temperature, in some embodiments.

In accordance with another embodiment, an RF power detector includes an RF transistor having a base coupled to a biasing circuit. RF input signal is coupled to the base of the RF transistor via a capacitor, and a resistor coupled to a collector of the RF transistor converts the RF signal level into an output voltage. Robust operation against temperature and/or power supply voltage drift is achieved.

In RF systems, the power of a radio frequency (RF) signal or a microwave signal within different nodes of the RF systems, or sub-systems of the RF system, is sometimes measured for control and operation of the RF system. In some embodiments, the RF system is implemented on one or more integrated circuits (ICs), and the measurement of RF signal power is performed in the ICs by one or more RF power detector circuits. An RF power detector circuit converts the RF signal level (also referred to as RF power level) into a signal, e.g. a DC voltage, which is measured to form an estimate of the RF signal level for further processing. For example, the estimated RF power provides external or internal supervisory devices with system knowledge that may be used, e.g., to control the radiated output power of a transmitter, or to measure a reflected power signal due to antenna mismatch. The estimated RF power may also be used to calibrate the transmit path or receive path in a customer applications (e.g., built-in test equipment). Additionally, the estimated RF power may be used to support characterization of integrated sub-systems during production testing. Power detector circuits may require a sufficient sensitivity to convert small RF power levels into signals (e.g., DC voltages) with good readout amplitude.

Figure 1B:
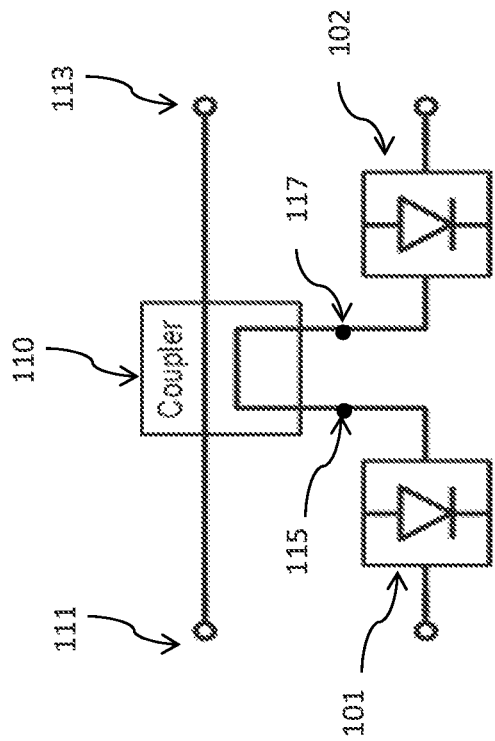
FIGS. 1A and 1B illustrate different methods to measure RF signal powers using RF power detectors, in some embodiments.
Figure 1A:
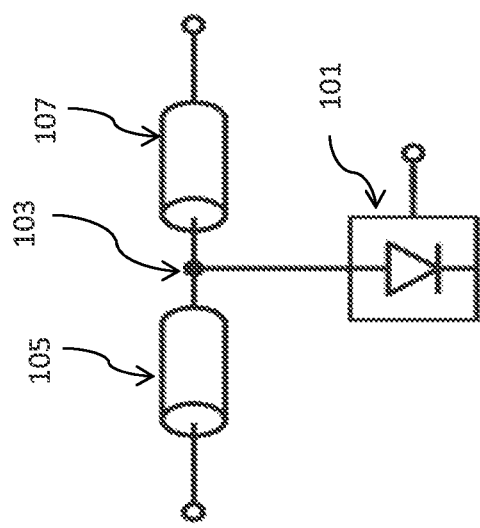

FIGS. 1A and 1B illustrate two examples of measuring RF signal levels using RF power detector circuits. In FIG. 1A, a power detector 101 is coupled to a node 103 of an RF signal path including transmission line 105 and transmission line 107, and measures the RF signal level at node 103. In the example of FIG. 1A, a low detuning of the transmitted RF signal by power detector 101 helps to reduce the influence on the RF signal transfer, which influence may be caused, e.g., by either power detector 101 drawing too much power from the transferred RF signal, or by power detector 101 introducing a mismatch at the connection node 103 interrupting the RF signal transfer.

In FIG. 1B, a directional coupler 110 is used to select forward or reverse travelling power signals. Directional coupler 110 has an input port 111, a transmitted port 113, a coupled port (may also be referred to as a forward-coupled port) 115 and an isolated port (may also be referred to as a reverse-coupled port) 117. As illustrated in FIG. 1B, an RF power detector 101 is connected to coupled port 115, and another power detector 102 is connected to isolated port 117. Power detector 101 and power detector 102 may be the same type of power detector, although different types of power detectors may also be used. Power detector 101 is matched to the transmission lines of the coupled path for improved performance. If power detector 101 is not matched to the transmission lines, the sensitivity of power detector 101 may be degraded. For example, when RF signal is injected at input port 111, and when there is an impedance mismatch between power detector 101 and the transmission line, the coupled signal in the forward path may be reflected at the unmatched power detector 101, arriving at the opposite side of the coupling line and generating a readout at power detector 102 in the reverse path, thus distorting the differentiation between forward readout at power detector 101 and reverse readout at power detector 102. If RF signal is injected at the transmitted port 113, the roles of the coupled port 115 and isolated port 117 switch, as well as the roles of power detector 101 and power detector 102, in some embodiments.

Figure 2A:
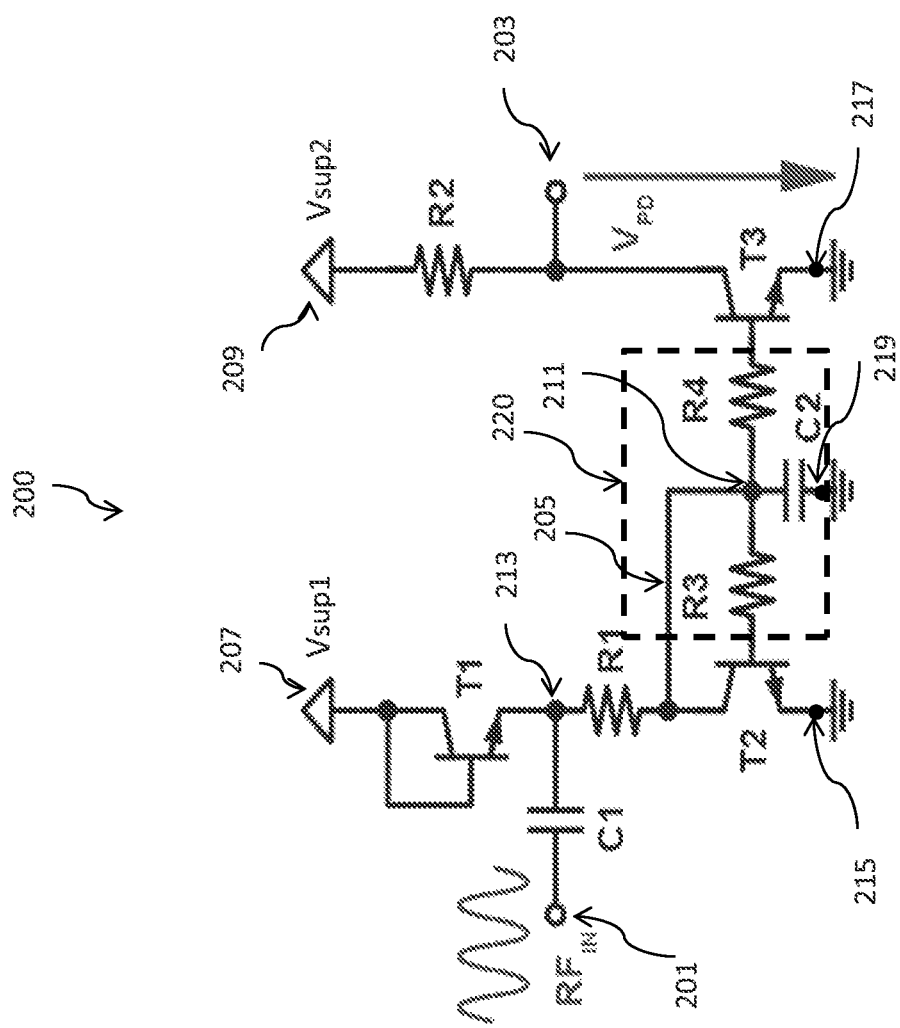
FIG. 2A illustrates an RF power detector, in accordance with some embodiments.

FIG. 2A illustrates an RF power detector circuit 200, according to an embodiment. As illustrated in FIG. 2A, power detector 200 includes a transistor T2 and a transistor T3. The transistors used in the present disclosure (e.g., transistors in FIG. 2A, FIG. 3, FIG. 10 and FIG. 11) may be bipolar transistors or field-effect transistors (e.g., metal-oxide-semiconductor field-effect transistors (MOSFETs)). In embodiments where bipolar transistors are used, the terminals of a transistor include an emitter, a collector and a base. In embodiments where field-effect transistors are used, the terminals of a transistor include a source, a drain and a gate. The discussion herein uses bipolar transistors as examples, with the understanding that field-effect transistors may also be used. For example, the emitter, the collector and the base may be changed to a source, a drain and a gate, respectively, when field-effect transistors are used in replace of the bipolar transistors.

As illustrated in FIG. 2A, the emitter of transistor T2 is coupled (e.g., electrically coupled) to a reference voltage node 215, which is coupled to a reference voltage, e.g., electrical ground. The collector of transistor T2 is coupled to a first terminal (e.g., the cathode) of a rectifying diode T1 via a resistor R1. A second terminal (e.g., the anode) of the rectifying diode T1 is coupled to a first power supply voltage node (may also be referred to as supply voltage node) 207, which is coupled to a power supply circuit (e.g., power supply circuit 230 in FIG. 2B) such as a voltage source.

Rectifying diode T1 may be a transistor (e.g., an RF transistor) in diode configuration. For example, rectifying diode T1 may be an RF transistor with the collector and the base of the RF transistor coupled together, as shown in FIG. 2A. The RF signal to be measured by RF power detector 200 is injected at input terminal 201, which is coupled to the rectifying diode T1 at node 213 via a capacitor C1.

In FIG. 2A, the base of transistor T2 is coupled to the base of transistor T3 via a low-pass filter network 220, which includes resistor R3, resistor R4 and capacitor C2. Resistor R3 is coupled between the base of transistor T2 and a node 211, resistor R4 is coupled between node 211 and the base of transistor T3, and capacitor C2 is coupled between node 211 and a reference voltage node 129, which is coupled to the reference voltage (e.g., electrical ground). As illustrated in FIG. 2A, the collector of transistor T2 is coupled to node 211 via an electrically conductive path (e.g., a copper line) 205.

Still referring to FIG. 2A, the emitter of transistor T3 is coupled to a reference voltage node 217, which is coupled to the reference voltage (e.g., electrical ground). The collector of transistor T3 is coupled to a second power supply voltage node 209 via a resistor R2. The second power supply voltage node 209 may be coupled to another power supply circuit such as a voltage source. The output terminal 203 of power detector 200 is coupled to the collector of transistor T3.

Parameters of various components of RF power detector 200 may be selected to achieve certain performance criteria (e.g., sensitivity, impedance matching), and may depend on various aspects of the circuit and system implementation. The factors influencing the parameters of the components of RF power detector 200 may include power supply voltage, RF input power, operating frequency, coupling factor, temperature range, transistor technology and the precision and range of a voltage readout unit (e.g., analog-to-digital converter), as examples. In accordance with an embodiment, resistor R1 has a resistance between about 100 ohm (Ω) to about 500Ω, such as 100Ω. In the illustrated embodiment, resistor R2 has a resistance between about 800Ω to about 1000Ω, such as 800Ω. Capacitor C1 has a capacitance between about 200 femtofarad (fF) to about 600 fF, such as 200 fF, and capacitor C2 has a capacitance between about 200 fF to about 600 fF, such as 200 fF. In addition, resistor R3 has a resistance between about 1 kilo-ohm (kΩ) to about 10 kΩ, such as 6.6 kΩ, and resistor R4 may have a resistance between about 1 kΩ to about 10 kΩ, such as 1 kΩ. The size ratio (e.g., ratio of physical sizes) between transistor T3 and transistor T2, also referred to as the mirror ratio between transistor T3 and transistor T2, is between about 2 and about 9, such as 6.6. In some embodiments, power supply voltage node 207 is coupled to a first voltage source, and power supply voltage node 209 is coupled to a second voltage source. The first voltage source may provide a constant voltage Vsup1 at, e.g., a nominal voltage value, such as 1.5V, in some embodiments. In other embodiments, the first voltage source provides a time-varying voltage Vsup1, for example, a voltage that changes in accordance with the environment temperature of the RF power detector 200 to compensate for temperature-induced variations in the output voltage of RF power detector 200. The second voltage source provides a constant voltage Vsup2 at, e.g., a nominal voltage value, such as 1.5V, in some embodiments. Other values for the parameters of the components of RF power detector 200 are also possible, depending on various aspects of the circuit and system implementation, as discussed above.

During operation of power detector 200, the RF input signal modulates the base-emitter voltage of diode connected transistor T1, which results in a corresponding non-linear change in current through transistor T1. This non-linear change in current may have an exponential relationship with the RF input voltage.

Resistor R1 and capacitor C2 serve as a lowpass filter that allows the DC component of the non-linear signal produced by transistor T1 to be applied to the bases of transistors T2 and T3 while shunting the RF components of the non-linear signal to ground via capacitor C2. Thus, the current that flows through both transistors T2 and T3 are proportional to the DC components of the non-linear signal, which is proportional to the power of RF signal $RF_{IN}$. The current through transistor T3 is converted to a voltage across resistor R3 to produce an output voltage proportional to the input power of RF signal $RF_{IN}$.

Broadband matching is achieved by coupling series resistor R1 to an RF ground via capacitor C2 and transistors T1 and T2. Effectively, resistor R1 forms the resistive matching part to the input port of the power detector.

Since the sensitivity of power detector 200 is affected both by temperature and power supply voltage Vsup1, in various embodiments, power supply voltage Vsup1 may be used to calibrate the nominal sensitivity of power detector 200 and/or compensate the sensitivity of power detector 200 for changes in temperature. For example, as shown in FIG. 2B, power supply circuit 230 may produce an adjustable power supply voltage that varies over temperature and/or that may be calibrated to provide a predetermined nominal sensitivity.

Figure 2B:
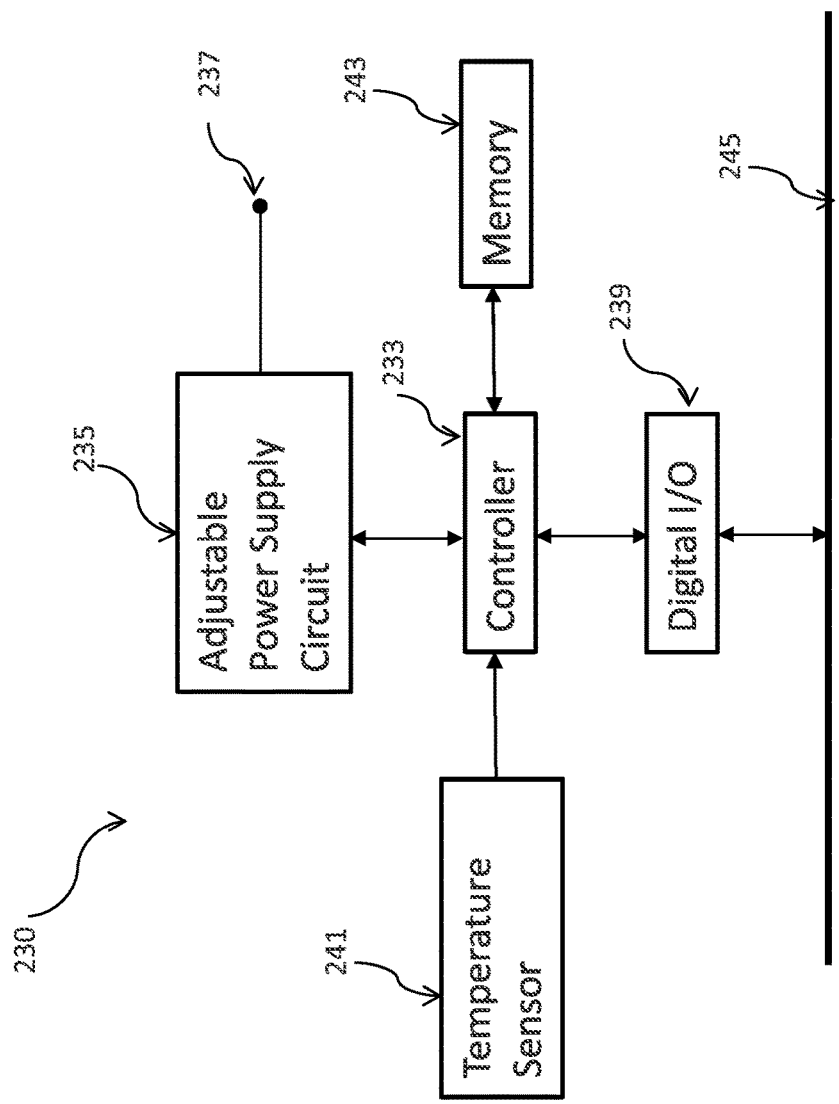
FIG. 2B illustrates a power supply circuit, in some embodiments.

FIG. 2B illustrates a power supply circuit 230 that may be used to provide a power supply voltage at output port 237, which may be coupled to, e.g., the first power supply voltage node 207 or the second power supply voltage node 209 in FIG. 2A. For example, a first power supply circuit and a second power supply circuit may be used to provide a first voltage Vsup1 and a second voltage Vsup2 at power supply voltage nodes 207 and 209, respectively. In some embodiments, power supply circuit 230 includes a controller 233, a memory 243, a temperature sensor 241, and an adjustable power supply circuit 235. Controller 233 monitors the temperature measured by temperature sensor 241, and based on the measured temperature and parameters stored on memory 243, determines a supply voltage to be generated by adjustable power supply circuit 235. The parameters stored on memory 243 may be a look-up table that maps temperatures to different supply voltages, as an example. The look-up table may be predetermined by analysis, experiment, other approaches, or combinations thereof, to select power supply voltages that compensate for the temperature changes, such that a predetermined nominal sensitivity is achieved. In other embodiments, controller 233 may instruct adjustable power supply voltage to provide a constant voltage at output port 237. Adjustable power supply circuit 235 is configured to generate a power supply voltage determined by controller 233 at output port 237. As illustrated in FIG. 2B, power supply circuit 230 may optionally include a digital I/O interface 239 that communicates to other control/communication modules (not shown) via serial or parallel data bus 245.

The output voltage Vpd of power detector 200 at output terminal 203 may have temperature-induced variations (e.g., voltage Vpd at output terminal 203 may change with temperature when input RF signal level is constant), in which case the power supply voltage Vsup1 (e.g., voltage at output terminal 237 of power supply circuit 230) applied to power supply voltage node 207 may be adjusted to compensate for the temperature, thereby reducing temperature-induced variations in the output voltage Vpd of power detector 200. An example of adjusting the power supply voltage to reduce temperature-induced variations is discussed hereinafter with reference to FIGS. 9A and 9B.

Figure 3:
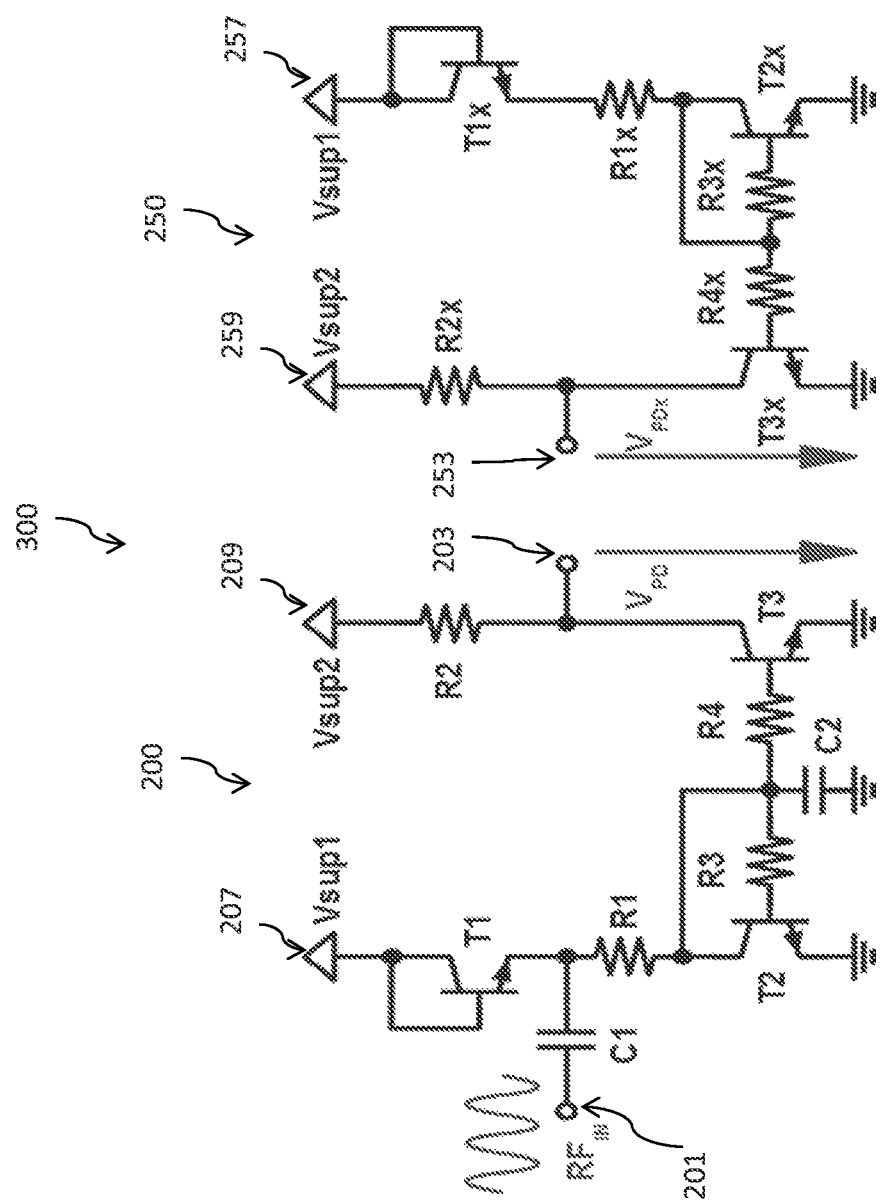
FIG. 3 illustrates an RF power detector with a pair of differential outputs, in some embodiments.

In various embodiments, the initial DC offset at the output of power detector 200 may be removed by performing a differential measurement of the output of power detector 200 with respect to an output of a replica bias circuit 250 as illustrated in FIG. 3. In FIG. 3, RF power detector 300 includes a first RF power detector circuit 200, which is the same as RF power detector 200 in FIG. 2A. RF power detector 300 further includes a reference circuit 250, which is similar to the first RF power detector circuit 200, except that capacitors C1 and C2 are omitted. Input RF signal is injected at terminal 201 of the first RF power detector circuit 200. In FIG. 3, like reference numbers represent like components. For example, the first RF power detector circuit 200 has a rectifying diode T1, and the reference circuit 250 has a rectifying diode T1x that is the same type of rectifying diode as T1. Similarly, resistor R3 in the first RF power detector circuit 200 and resistor R3x in the reference circuit 250 has the same resistance value. Power supply voltage node 207 of the first RF power detector circuit 200 and power supply voltage node 257 of the reference circuit 250 are supplied with a first voltage Vsup1, and power supply voltage node 209 of the first power detector circuit 200 and power supply voltage node 259 of the reference circuit 250 are supplied with a second voltage Vsup2, in some embodiments.

The output terminal 253 of the reference circuit 250 may be used with the output terminal 203 of the first RF power detector circuit 200 to form a pair of differential output terminals. By using the reference circuit 250, RF power detector circuit 300 is able to compensate for process variations of the circuit components and thus, is more robust against process variations, in accordance with some embodiments. The differential outputs may also provide robustness against power supply voltage drift.

Figure 4:
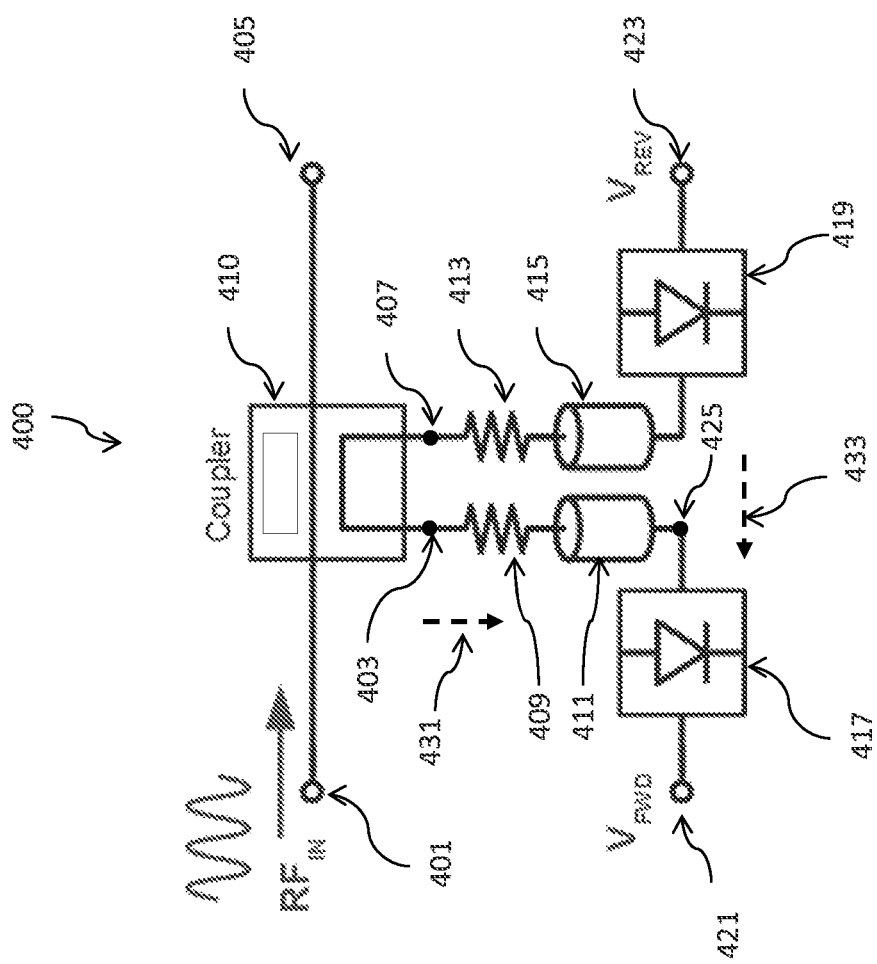
FIG. 4 illustrates a circuit for measuring RF signal powers using the RF power detector in FIG. 2A or FIG. 3 and a directional coupler, in some embodiments.

FIG. 4 illustrates a circuit 400 for measuring RF signal levels using RF power detector 300 in FIG. 3 (or RF power detector 200 in FIG. 2A) and a directional coupler 410, which may be a bi-directional coupler. In FIG. 4, the RF signal to be measured is injected at an input port 401 of directional coupler 410. The input terminal of a first RF power detector 417 (e.g., power detector 300 of FIG. 3) is coupled to a forward-coupled port 403 of directional coupler 410 via a matching circuit consisting for example of a resistor 409 and a transmission line 411. The input terminal of a second RF power detector 419 (e.g., another RF power detector 300 of FIG. 3) is coupled to a reverse-coupled port 407 of directional coupler 410 via a resistor 413 and a transmission line 415. The output terminal of the first RF power detector 417 is coupled to output terminal 421, and the output terminal of the second RF power detector 419 is coupled to output terminal 423. In the example of FIG. 4, the first power detector 417 is used to measure the RF signal power at the forward-coupled port 403 in the forward path, and the second power detector 419 is used to measure the RF signal power at the reverse-coupled port 407 in the reverse path. As an example, resistors 409 and 413 in FIG. 4 may have a resistance of 7Ω, and transmission lines 411 and 415 may have an impedance of 50Ω.

Figure 5:
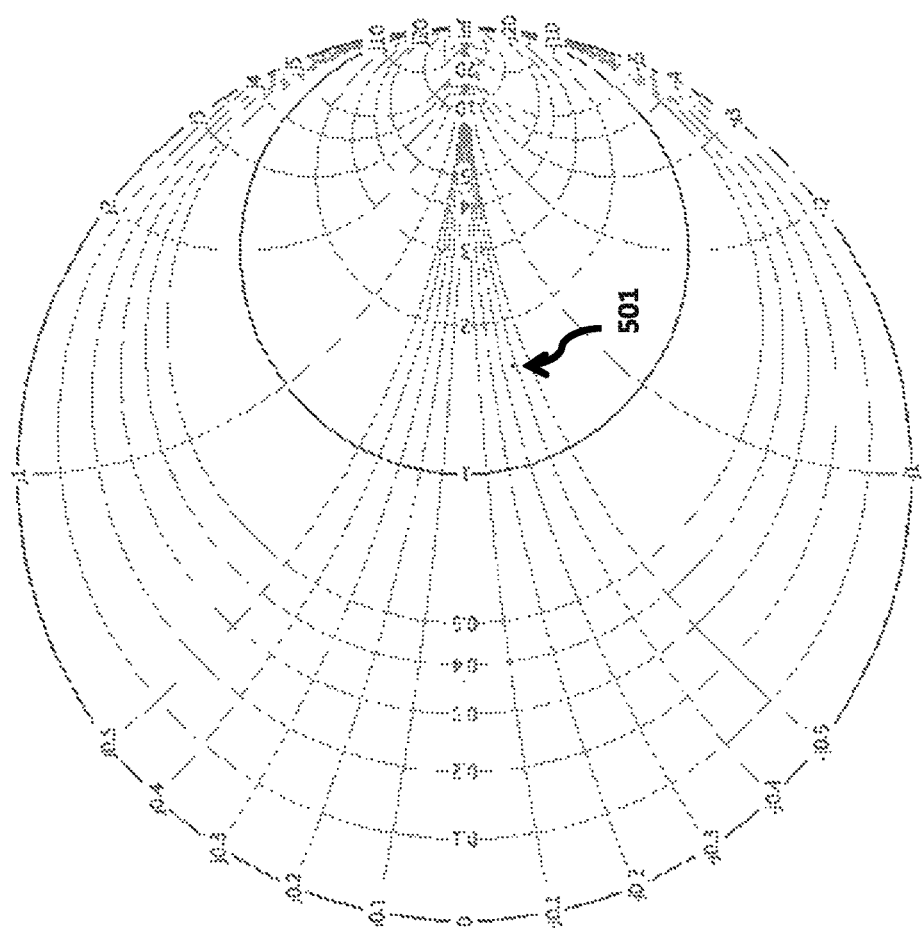
FIGS. 5 and 6 are Smith charts illustrating the normalized impedance and reflection coefficients for the circuit of FIG. 4, in some embodiments.

The Smith chart showing the normalized impedance and reflection coefficients for the input of RF power detector 417 in FIG. 4 (e.g., looking at node 425 along direction 433) is illustrated in FIG. 5. Locus 501 corresponds to an RF frequency range from 57 GHz to 66 GHz. It is seen from FIG. 5 that locus 501 is only to some extent close to the center of the Smith chart, but with a small locus circle due to a resistive match. From a operation perspective, this matching may not be sufficient, because some power will be reflected at the interface of power detectors 417 and propagate to the other side of coupler 410 to node 407 and will distort the readout of the opposite power detector 419.

Figure 6:
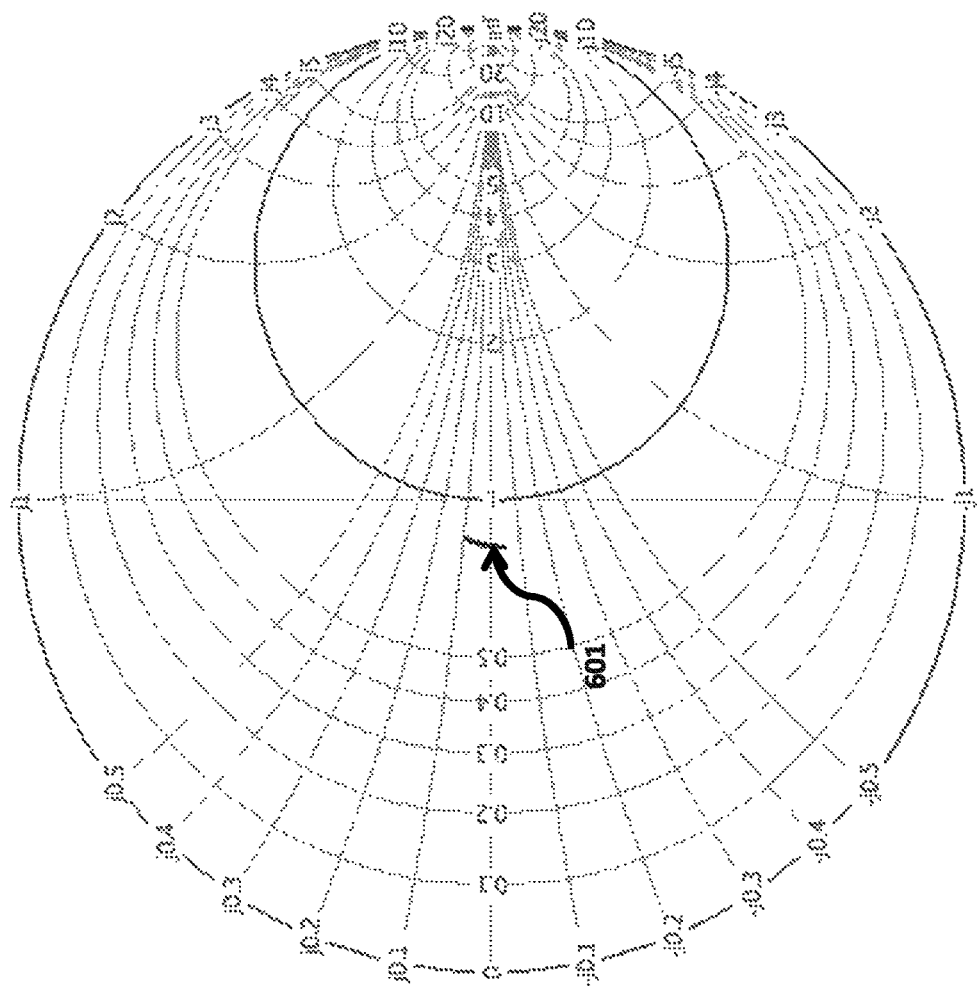
Figure 7:
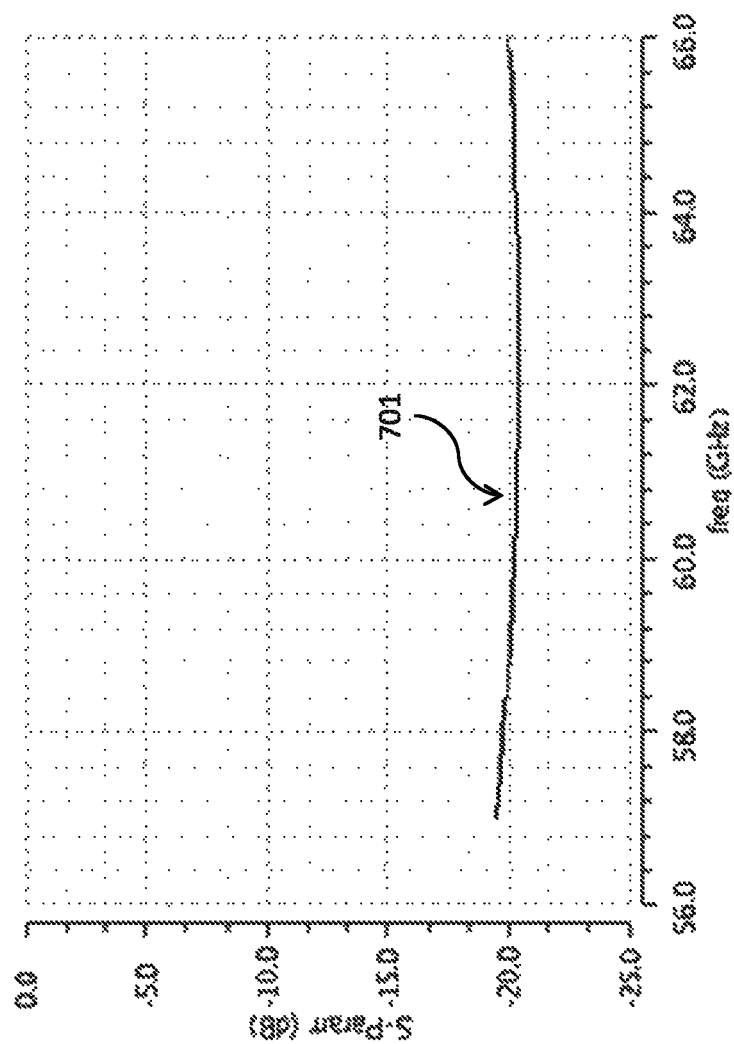
FIG. 7 illustrates the reflection coefficients for the circuit of FIG. 4, in some embodiments.

FIG. 6 shows the Smith chart for the normalized impedance and reflection coefficients for RF power detector 417 in FIG. 4 with matching components 409/411 (e.g., looking at node 403 along direction 431). Locus 601 corresponds to an RF frequency range from 57 GHz to 66 GHz. It is seen from FIG. 6 that broadband matching is achieved across a wide frequency range (e.g., 57 GHz~66 GHz). Such embodiment matching techniques may achieve matching over a broader bandwidth than systems that only rely on LC matching networks to match components. The reflection coefficient S11 corresponding to FIG. 6 is illustrated by curve 701 in FIG. 7, which shows return loss of about 20 dB across the frequency range of 57 GHz to 66 GHz, thus ensuring little or no distortion to power detector 419.

Figure 8:
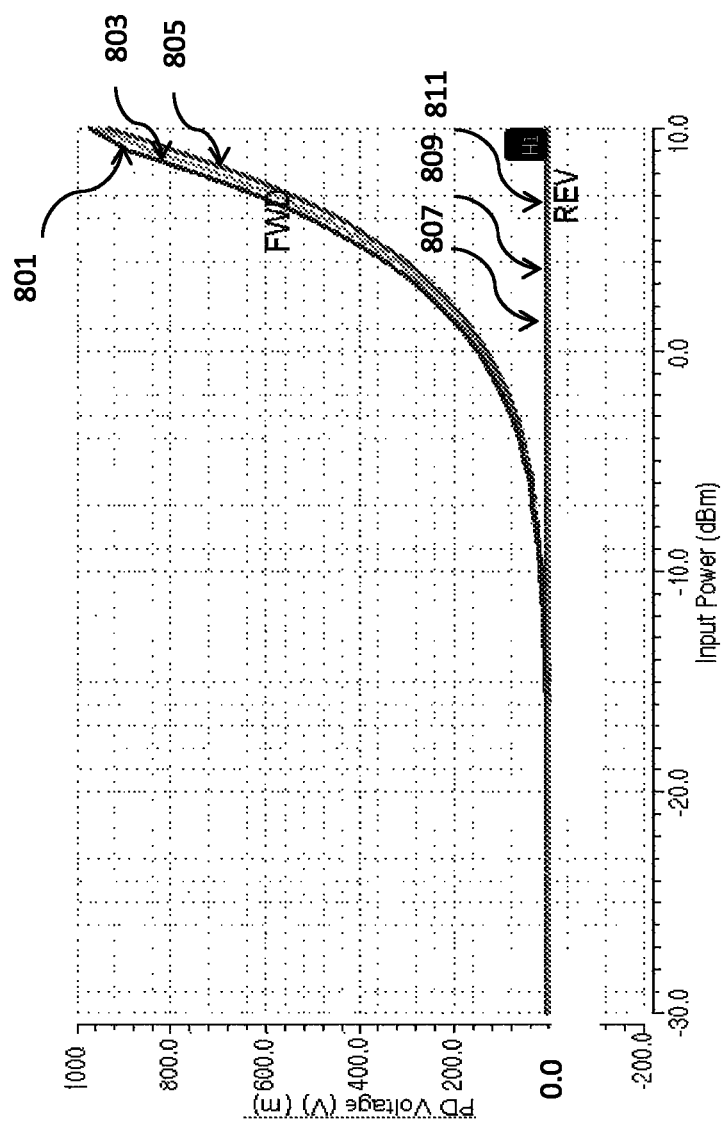
FIG. 8 illustrates the output voltages of RF power detectors in the forward path and the reverse path for the circuit of FIG. 4, in some embodiments.

FIG. 8 illustrates simulation results for the outputs of RF power detectors 417/419 in FIG. 4 versus the input RF power level. The simulations of FIG. 8 were performed for a temperature of 27° C. for three RF frequencies (57 GHz, 60.5 GHz, and 64 GHz) and for RF signal levels ranging from −30 dBm to 10 dBm. The directional coupler 410 used in the simulation has a coupling factor of 15 dB and a directivity of better than 30 dB in the operating frequency range. Curves 801, 803, and 805 correspond to the output voltage $V_{FWD}$ of RF power detector 417 (see FIG. 4) at RF frequency of 64 GHz, 60.5 GHz, and 57 GHz, respectively. Curves 807, 809, and 811 correspond to the output voltage $V_{REV}$ of RF power detector 419 (see FIG. 4) at RF frequency of 64 GHz, 60.5 GHz, and 57 GHz, respectively.

Due to the good impedance matching across the wide frequency band (e.g., 57 GHz to 64 GHz), there is very little RF signal power reflected from the forward path to the reverse path. Therefore, the output voltage $V_{REV}$ of RF power detector 419 (curve 807, 809 and 811) remains smaller than 5 mV (which is the ADC resolution for measuring $V_{REV}$ used in the simulations) across the input signal power range simulated. As a result, curves 807, 809, and 811 in FIG. 8 overlap and show as a flat curve across the RF signal level simulated. As illustrated in FIG. 8, curves 801, 803, and 805, which show the output voltage $V_{FWD}$ at the output of RF power detector 417 for difference RF frequencies, have very little spread (e.g., output voltage differences at a same input RF signal level). This again indicates that a good wideband impedance matching is achieved by the presently disclosed RF power detectors.

FIG. 9A illustrates the simulated output voltage $V_{FWD}$ of RF power detector 417 in FIG. 4 versus input RF signal level at an RF frequency of 60.5 GHz and different temperatures (e.g., the environment temperature of the RF power detector). In particular, curves 901, 903 and 905 correspond to a temperature of −40° C., 27° C., and 90° C., respectively. The wide spread between curves 901, 903, and 905 (e.g., for RF signal level in the range from −10 dBm to 10 dBm) indicates that the output voltage of power detectors 417 is affected by temperature. In the simulation of FIG. 9A, power supply voltages Vsup1 and Vsup2 (see FIG. 3) are at a nominal value of 1.5 V. To reduce the temperature-induced variations in the output voltage of power detectors, power supply voltages Vsup1 at power supply voltage node 207 (see FIG. 3) may be adjusted in accordance with the temperature to compensate for the temperature variations.

FIG. 9B illustrates the simulated output voltage $V_{FWD}$ of RF power detector 417 in FIG. 4 under similar conditions as FIG. 9A, but with power supply voltage Vsup1 adjusted in accordance with temperature. In particular, curve 901' corresponds to a temperature of −40° C. and a power supply voltage Vsup1 of 1.6 V, curve 903' corresponds to a temperature of 27° C. and a power supply voltage Vsup1 of 1.5 V, and curve 905' corresponds to a temperature of 90° C. and a power supply voltage Vsup1 of 1.4 V. Power supply circuits, such as power supply circuit 230 in FIG. 2B, may be used to provide the power supply voltage Vsup1. Power supply voltage Vsup2 is at the nominal value of 1.5V in the simulation of FIG. 9B. Simulation results in FIG. 9B show that with Vsup1 being varied to compensate for temperature variations, the spread between curves 901', 903', and 905' are greatly reduced compared with FIG. 9A. Therefore, power detectors 200 and 300 not only have good impedance matching over a wide frequency band, but also could provide robustness against temperature-induced variations when power supply voltage (e.g., Vsup1) is adjusted to compensate for temperature change.

In the simulation of FIGS. 9A and 9B, RF frequencies in the range of 57 GHz to 64 GHz and a supply voltage of 1.5 V are used as examples. It is understood that RF power detectors 200 and 300 may also be used for other frequency ranges and other supply voltages.

RF power detector circuits 200 and 300 as illustrated in FIG. 2A and FIG. 3 have many advantages. The biased rectifying diode T1 is enhanced with a current mirror and built-in low pass filter network. The resistor R1 in the rectifier branch (e.g., the branch including T1, R1 and T2) sets the biasing current for diode T1, but due to the second transistor T2, a small resistance (e.g., about 100Ω) for resistor R1 can be used. The small resistance of R1 allows for good impedance matching, as illustrated by the results shown in the Smith charts in FIGS. 5 and 6. Furthermore, since the sensitivity and the voltage span of the power detector circuit can be adjusted by adjusting the mirror ratio of transistors T3 and T2, and/or by adjusting the resistance of R2, the biasing and the conversion of power detector output voltage are made independent from each other, which allows for good trade-offs in scaling the components. Note that transistor T2 introduces further parasitic capacitance to the input node, which should be considered for matching or detuning.

Figure 10:
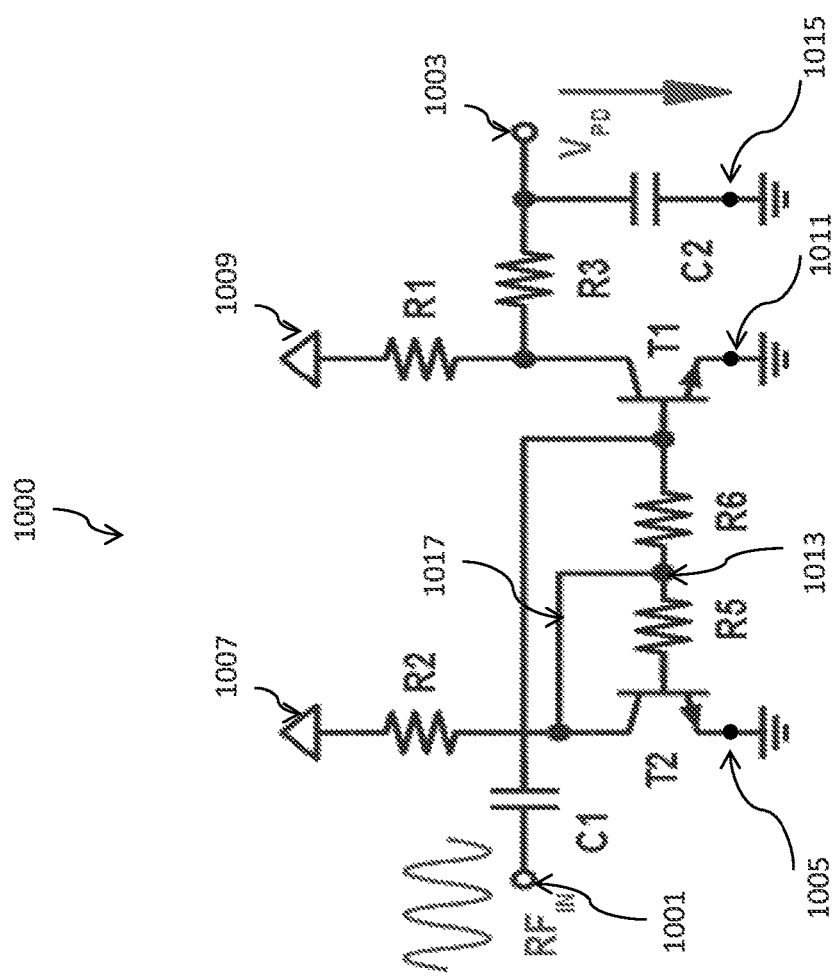
FIG. 10 illustrates another RF power detector, in some embodiments.

FIG. 10 illustrates another RF power detector 1000, in accordance with some embodiments. In FIG. 10, RF power detector 1000 includes a transistor T1 and resistor R1 in a first branch, and a transistor T2 and a resistor R2 in a second branch. Resistor R1 is coupled between a power supply voltage node 1009 and the collector of transistor T1, and the emitter of transistor T1 is coupled to a reference voltage node 1011. In some embodiments, power supply voltage node 1009 is coupled to a power supply circuit (e.g., power supply circuit 230 in FIG. 2B) such as a voltage source, and reference voltage node 1011 is coupled to a reference voltage level (e.g., electrical ground). RF input signal is supplied at input terminal 1001, which is coupled to the base of transistor T1 via a capacitor C1. An output terminal 1003 is coupled to the collector of transistor T1 via a low-pass filter that includes resistor R3 and capacitor C2.

Still referring to FIG. 10, resistor R2 is coupled between power supply voltage node 1007 and the collector of transistor T2. The emitter of transistor T2 is coupled to a reference voltage 1005, which is coupled to a reference voltage (e.g., electrical ground). Resistor R5 is coupled between the base of transistor T2 and a node 1013, and resistor R6 is coupled between node 1013 and the base of transistor T1. The collector of transistor T2 is coupled to node 1013 via an electrically conductive path (e.g., copper line) 1017.

Parameters of various components of RF detector 1000 may be selected to achieve certain performance criteria (e.g., sensitivity, impedance matching), and may depend on various aspects of the circuit and system implementation. The factors influencing the parameters of the components of RF power detector 1000 may include power supply voltage, RF input power, operating frequency, coupling factor, temperature range, transistor technology and the precision and range of a voltage readout unit (e.g., analog-to-digital converter), as examples. In accordance with an embodiment, resistor R1 has a resistance between about 1 kΩ to about 10 kΩ, such as 9 kΩ. In the illustrated embodiment, resistor R2 has a resistance between about 10 kΩ to about 50 kΩ, such as 20 kΩ, and resistor R3 has a resistance between about 20Ω to about 500Ω, such as 500Ω. Capacitor C1 has a capacitance between about 50 fF to about 150 fF, such as 100 fF, and capacitor C2 has a capacitance between about 50 fF to about 150 fF, such as 100 fF. In addition, resistor R5 has a resistance between about 0.5 kΩ to about 1.5 kΩ, such as 1 kΩ, and resistor R6 has a resistance between 0.5 kΩ to about 1.5 kΩ, such as 1 kΩ. The mirror ration between transistor T2 and transistor T1 may be between about 1 and about 9, such as 1. In some embodiments, power supply voltage node 1007 and power supply voltage node 1009 are coupled to a first voltage source, although difference voltage sources may also be used. For example, the first voltage source may provide a constant voltage at, e.g., a nominal voltage value such as 1.5 V, to power supply voltage nodes 1007 and 1009. Other values for the parameters of the components of RF power detector 1000 are also possible, depending on various aspects of the circuit and system implementation, as discussed above.

During operation, RF signal is injected through capacitor C1 to the base of transistor T1. Transistor C1 acts as a DC block to the injected RF signal. The biasing of transistor T1 may be performed by a single transistor current mirror comprised of transistor T2 and resistor R2, as shown in FIG. 10, although other biasing structures may also be used. In case of using the current mirror of FIG. 10, resistors R5 and R6 coupled between the bases of transistors T1 and T2 provide a high-ohmic node to the RF signal. The high-ohmic node may also be formed by replacing R6 with an inductance (not shown), but this may increase the layout area for implementation in integrated circuits (IC) and may impact broadband performance. The transistor T1 is biased at a low DC collector current level.

The injected RF signal generates a clipped collector current (see illustration in FIG. 17) at the low-biased transistor T1, which raises the DC current at the collector of transistor T1. The collector current, which resembles a rectified DC current with RF swing, is converted into a voltage by resistor R1 and filtered by the low-pass filter (comprised of R3 and C2) to remove or reduce RF swings. In the example of FIG. 10, the output voltage Vpd at terminal 1003 decreases with increased RF signal level. The impedance matching of RF power detector circuit 1000 varies with the size of transistor T1, and can be further influenced by matching components in the circuits prior to C1 (not shown). When a small transistor size of T1 is chosen, the detuning to an outside circuit is small and the amplification of T1 is increased, which in turn increases the sensitivity of RF power detector 1000. Other measures to control sensitivity includes adjustment of the biasing current (e.g. in the example of FIG. 10) and adjustment of the resistance of R1. When used with a coupler, a good impedance matching can be achieved by using a resistive termination in parallel to the power detector with little or no degradation of sensitivity. The resistive termination provides a very compact layout for implementation in IC, because no large transmission lines or inductances are used. The RF power detector 1000 may be operated without operational amplifier, in some embodiments.

Figure 11:
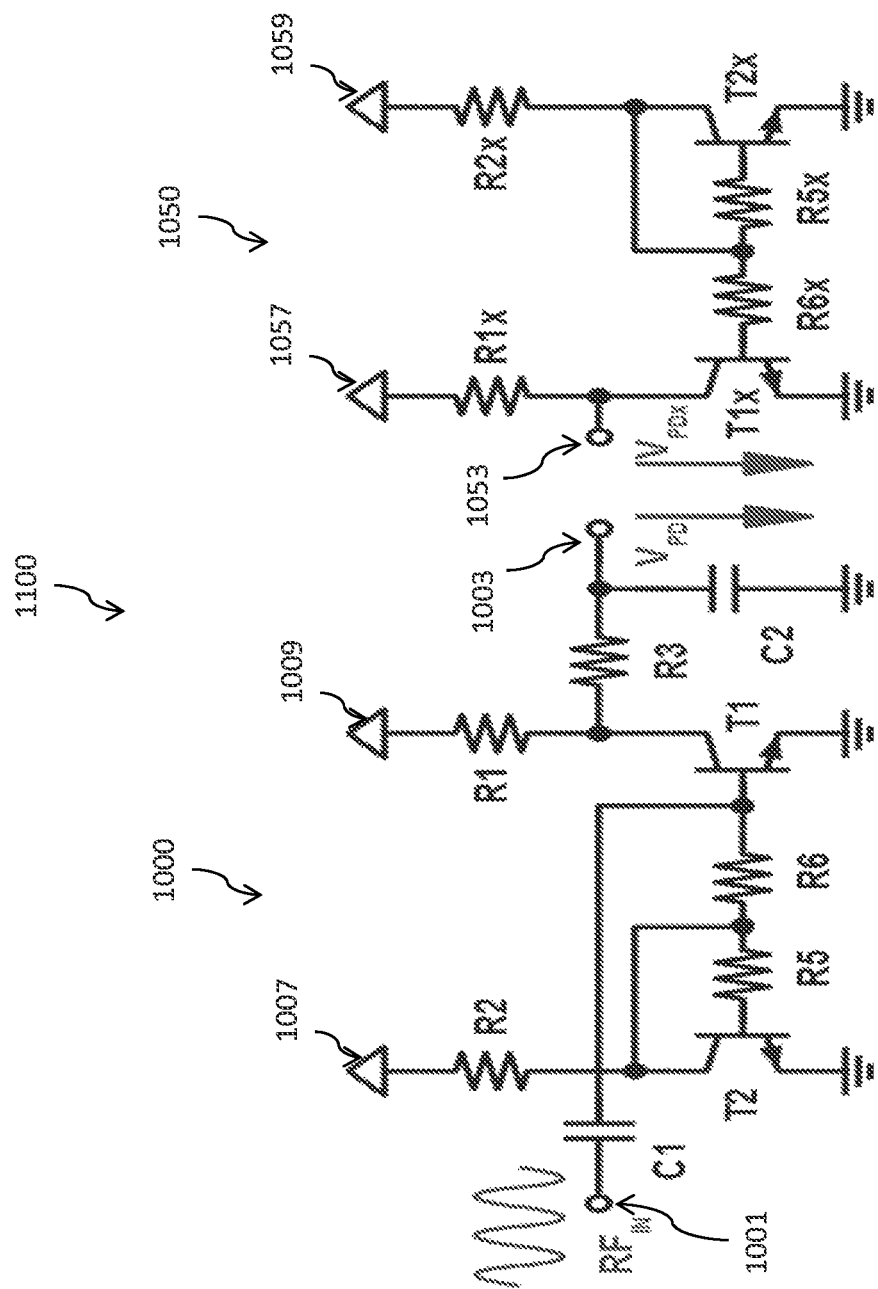
FIG. 11 illustrates another RF power detector with a pair of differential outputs, in some embodiments.

FIG. 11 illustrates another RF power detector 1100, in some embodiments. As illustrated in FIG. 11, RF power detector 1100 includes a first RF power detector circuit 1000, which is the same as RF power detector 1000 in FIG. 10. RF power detector 1100 further includes a reference circuit 1050, which is similar to the first RF power detector circuit 1000, except that capacitor C1 and the low-pass filter consisting of resistor R3 and capacitor C2 are omitted. RF signal is injected to input terminal 1001 of the first RF power detector circuit 1000. In FIG. 11, like reference numbers represent like components. For example, resistor R1 in the first RF power detector circuit 1000 and resistor R1x in the reference circuit 1050 may have the same resistance value. In accordance with an exemplary embodiment, power supply voltage nodes 1007, 1009, 1057 and 1059 are supplied with a same power supply voltage.

The output terminal 1053 of the reference circuit 1050 may be used with the output terminal 1003 of the first RF power detector circuit 1000 to form a pair of differential output terminals. By using the reference circuit 1050, RF power detector circuit 1100 is able to compensate for process variations of the circuit components, temperature drift, and/or power supply voltage drift, in accordance with some embodiments.

Figure 12:
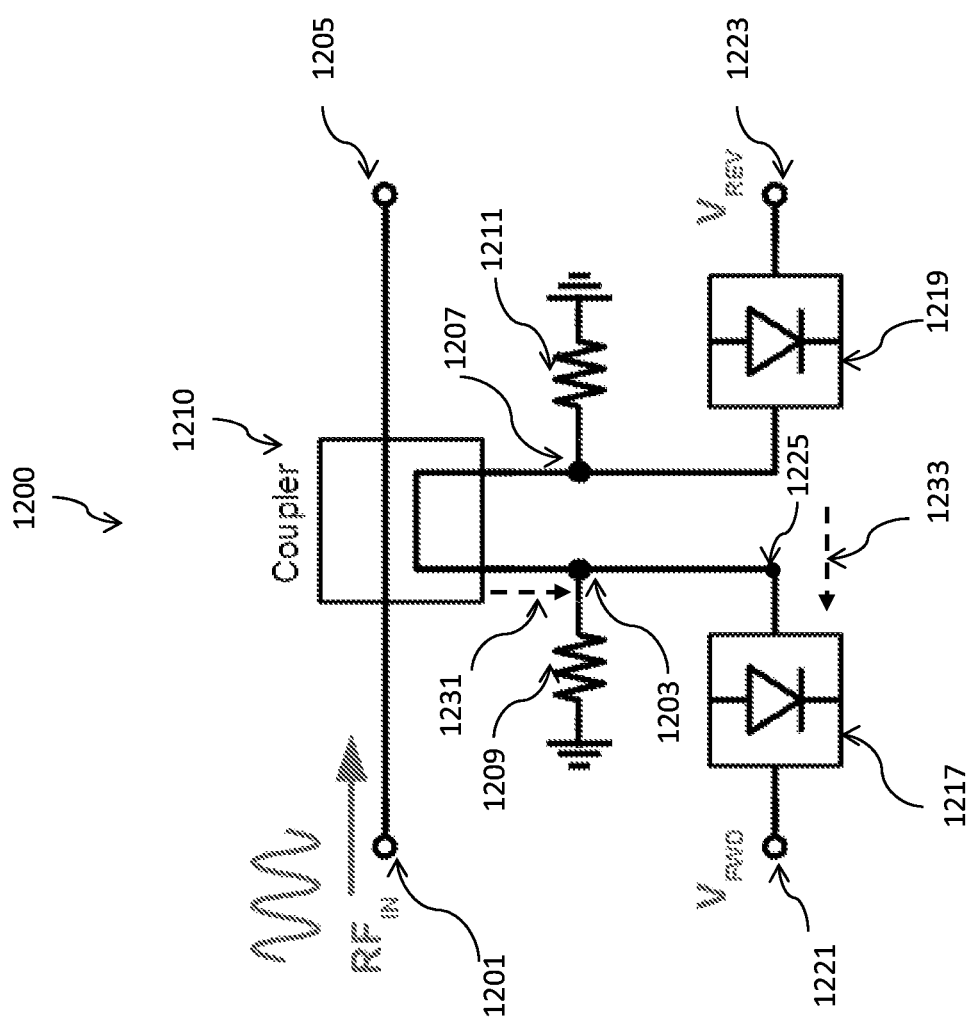
FIG. 12 illustrates a circuit for measuring RF signal powers using the RF power detector in FIG. 10 or FIG. 11 and a directional coupler, in some embodiments.

FIG. 12 illustrates a circuit 1200 for measuring RF signal levels using a power detector (e.g., power detector 1000 in FIG. 10) and a directional coupler 1210. In FIG. 12, the RF signal to be measured is injected at an input port 1201 of directional coupler 1210. The input terminal of a first RF power detector 1217, which may be the same as RF power detector 1100 of FIG. 11 (or 1000 of FIG. 10), is coupled to a forward-coupled port 1203 of directional coupler 1210. A termination resistor 1209 of, e.g., 55Ω, may be coupled between forward-coupled port 1203 and electrical ground. The input terminal of a second RF power detector 1219, which may be the same as RF power detector 1100 of FIG. 11 (or 1000 of FIG. 10), is coupled to a reverse-coupled port 1207 of directional coupler 1210. A termination resistor 1211 of, e.g., 55Ω, may be coupled between reverse-coupled port 1207 and electrical ground. The output terminal of the first RF power detector 1217 is coupled to output terminal 1221, and the output terminal of the second RF power detector 1219 is coupled to output terminal 1223. In the example of FIG. 12, the first power detector 1217 is used to measure the RF signal power in the forward path, and the second power detector 1219 is used to measure the RF signal power in the reverse path.

Figure 13:
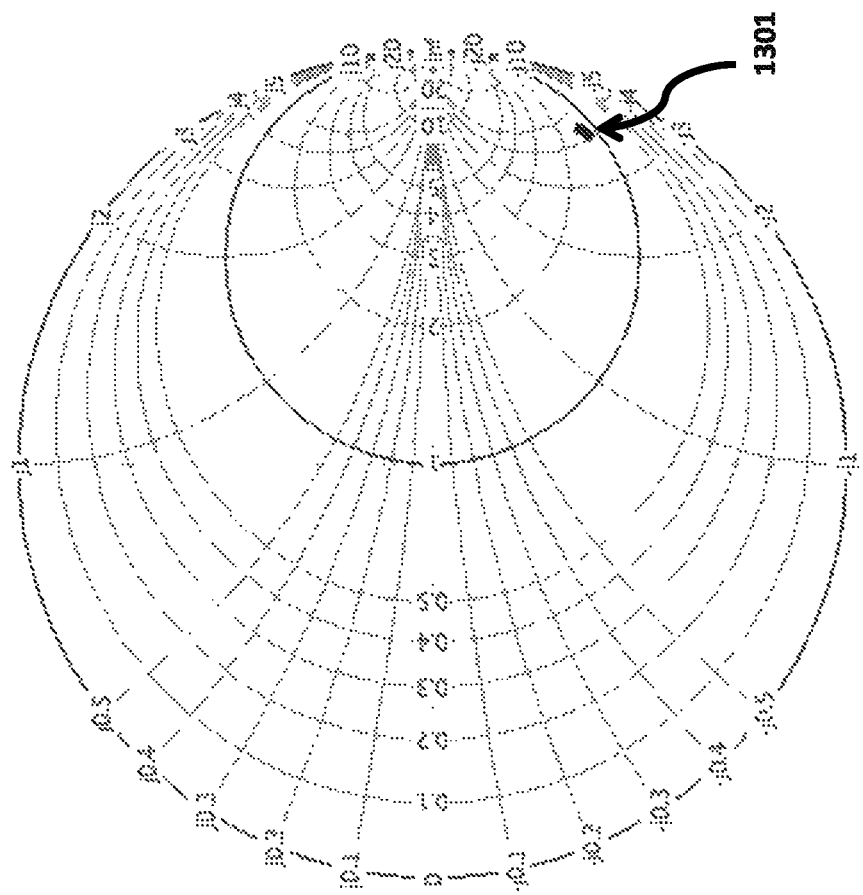
FIGS. 13 and 14 are Smith charts illustrating the normalized impedance and reflection coefficients for the circuit of FIG. 12, in some embodiments.
Figure 14:
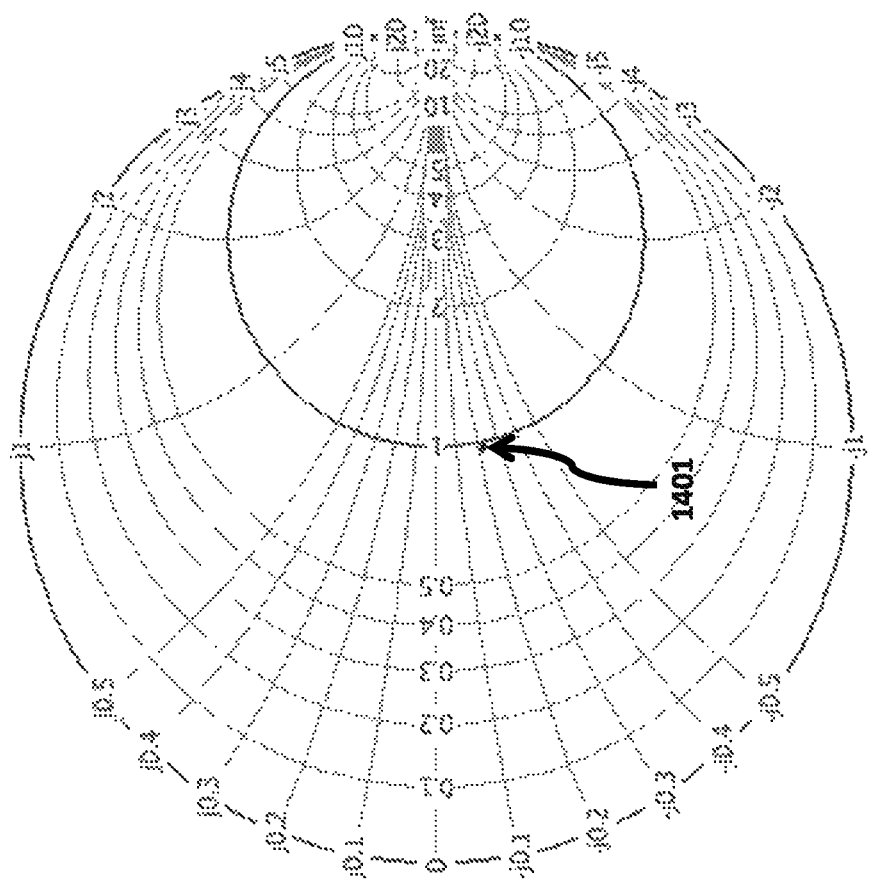
Figure 15:
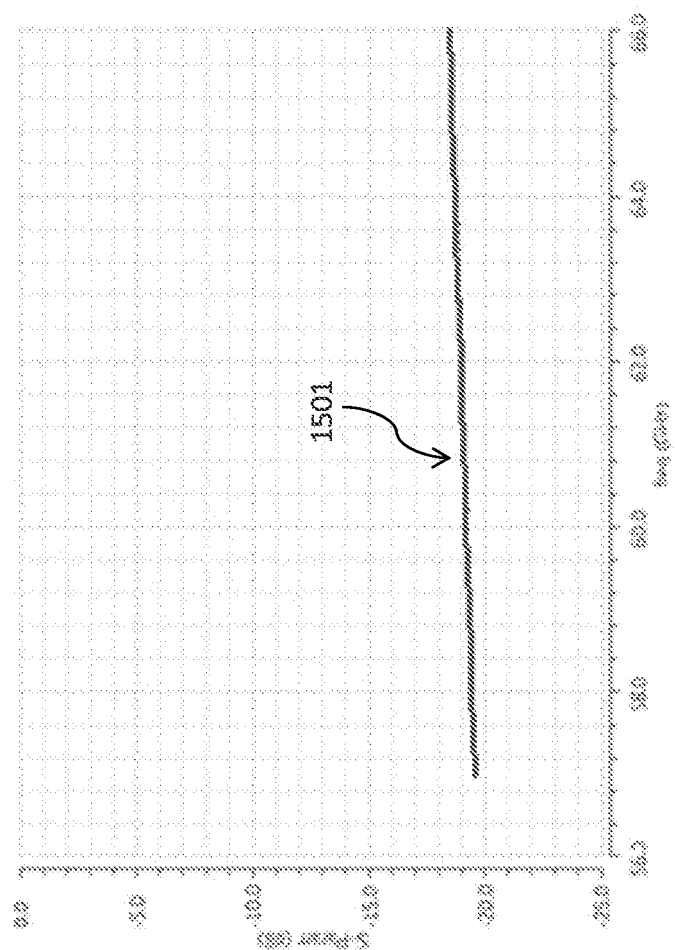
FIG. 15 illustrates a graph of reflection coefficients for the circuit of FIG. 12, in some embodiments.

The Smith chart for the normalized impedance and reflection coefficients for RF power detector 1217 in FIG. 12 (e.g., looking at node 1225 along direction 1233) is illustrated in FIG. 13. Locus 1301 corresponds to an RF frequency range between 57 GHz to 66 GHz. FIG. 14 shows the Smith chart for the normalized impedance and reflection coefficients for RF power detector 1217 in FIG. 12 with termination resistor 1209 (e.g., looking at node 1203 along direction 1231). Locus 1401 corresponds to an RF frequency range from 57 GHz to 66 GHz. It is seen from FIG. 14 that with the resistive termination (e.g., resistors 1209 and 1211), good impedance matching is achieved across a wide frequency range (e.g., 57 GHz~66 GHz). The reflection coefficient S11 corresponding to FIG. 14 is illustrated by curve 1501 in FIG. 15, which shows a return loss of about 20 dB across the frequency range of 57 GHz to 66 GHz. Note that the use of resistors (e.g., 1209, 1211) for termination may cause some loss of RF power in the resistors, however, since RF power detectors 1217/1219 have good sensitivity, performance degradation due to the use of resistive termination may be compensated by the good sensitivity, in some embodiments.

Figure 16:
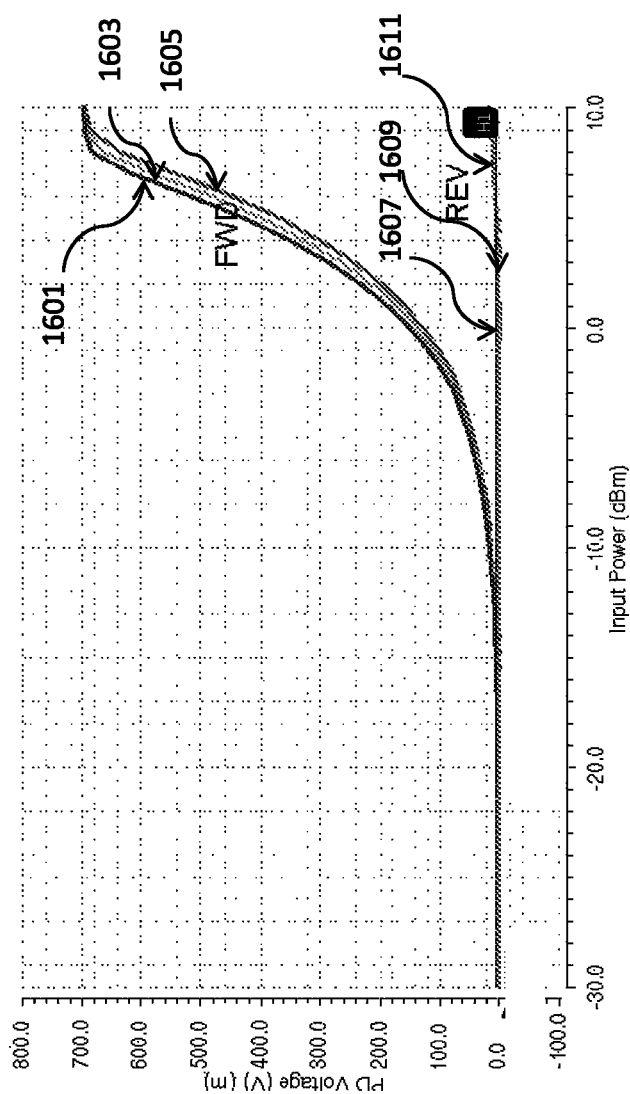
FIG. 16 illustrates a graph of the RF power detector output voltage versus RF input power in the forward path and the reverse path for the circuit of FIG. 12, in some embodiments.

FIG. 16 illustrates simulation results for the outputs of power detectors 1217 and 1219 in FIG. 12 versus the input RF power level. The simulations of FIG. 16 were performed for a temperature of 27° C. for three RF frequencies (57 GHz, 60.5 GHz, and 64 GHz) and for an RF signal level ranging from −30 dBm to 10 dBm. The directional coupler 1210 used in the simulation has a coupling factor of 15 dB and a directivity of better than 30 dB in the operating frequency range. Curves 1601, 1603, and 1605 correspond to the output voltage $V_{FWD}$ of RF power detector 1217 (see FIG. 12) at RF frequency of 64 GHz, 60.5 GHz, and 57 GHz, respectively. Curves 1607, 1609, and 1611 correspond to the output voltage $V_{REV}$ of RF power detector 1219 (see FIG. 12) at RF frequency of 64 GHz, 60.5 GHz, and 57 GHz, respectively.

Due to the good impedance matching across the wide frequency band (e.g., 57 GHz to 64 GHz), there is very little RF signal power reflected from the forward path to the reverse path. Therefore, the output voltage $V_{REV}$ of RF power detector 1219 is small across the range of RF signal level simulated. As illustrated in FIG. 16, the output voltage of RF power detector 1219 is smaller than 5 mV, which is the ADC resolution used in the simulation. As a result, curves 1607, 1609, and 1611 in FIG. 16 overlap and show as a flat curve across the range of RF signal level simulated.

As illustrated in FIG. 16, curves 1601, 1603, and 1605, which show the output voltage $V_{FWD}$ at the output of RF power detector 1217 for difference RF frequencies, have very little spread. This again indicates that a good wideband impedance matching is achieved by the presently disclosed RF power detectors. Simulations of circuit 1200 in FIG. 12 were also performed for different environment temperatures, the results of the simulations (not shown) indicate that RF power detectors 1000 and 1100 are robust to temperature change, with little temperature-induced variations in the output voltages of the RF power detectors were observed. The frequency range between 57 GHz and 64 GHz and the supply voltage of 1.5V are used in the simulations as a non-limiting example. RF power detectors 1000 and 1100 can be tuned for other frequency ranges and supply voltages.

Figure 17:
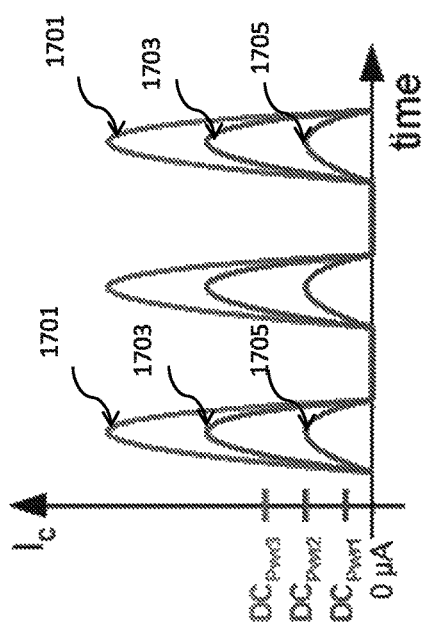
FIG. 17 shows the DC current in the collector of transistor T1 of FIG. 10, in some embodiments.
Figure 18:
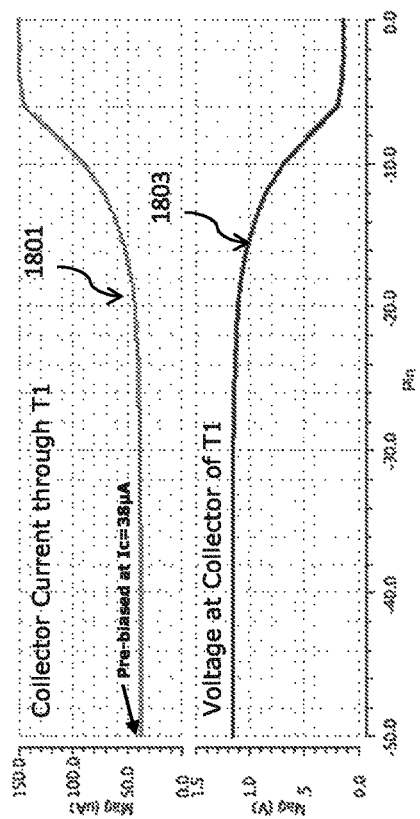
FIG. 18 shows a graph of the collector current of transistor T1 versus input RF signal level, and the voltage at the collector of transistor T1 versus input RF signal level, for transistor T1 of FIG. 10, in some embodiments.

FIG. 17 and FIG. 18 provide more details regarding the operation of RF power detectors 1000 and 1100. In particular, curves 1701, 1703 and 1705 in FIG. 17 show an idealized illustration of the DC current in the collector of transistor T1 (see FIG. 10) for three different RF signal levels applied at input terminal 1001. During idle operation, transistor T1 is biased at a low collector current. Incoming RF signal is amplified by transistor T1, the sine wave of RF signal is clipped close to the zero axis in the Y-direction (e.g., Ic=0), thus a DC current is generated in the collector of transistor T1 due to self-biasing of the rectified waveform. FIG. 18 is a multi-axis plot showing the DC current of transistor T1 versus input RF signal level (see curve 1801), and the DC voltage at the collector of transistor T1 versus input RF signal level (see curve 1803), which DC current and DC voltage are determined by resistor R1 in FIG. 10.

RF power detector circuits 1000 and 1100 as illustrated in FIG. 10 and FIG. 11 have many advantages. For example, by using a low biased RF transistor T1 and a collector resistance R1 to convert the RF signal level into an output voltage, good sensitivity of RF power detector (e.g., 1000 or 1100) is achieved. Compared with an RF detector implementation using a rectifying diode and an operational amplifier, a smaller detuning can be achieved at the same sensitivity. Due to the good sensitivity, broadband impedance matching can be achieved by placing the RF power detector in parallel to a resistive termination. This allows for a very compact layout in IC implementation, because transmission line or inductance matching components are not required. The RF power detector achieves sufficient output amplitude without operational amplifier. In addition, output of the disclosed RF power detectors (e.g., 1000 and 1100) is stable for varying temperatures or power supply voltage levels.

Figure 19:
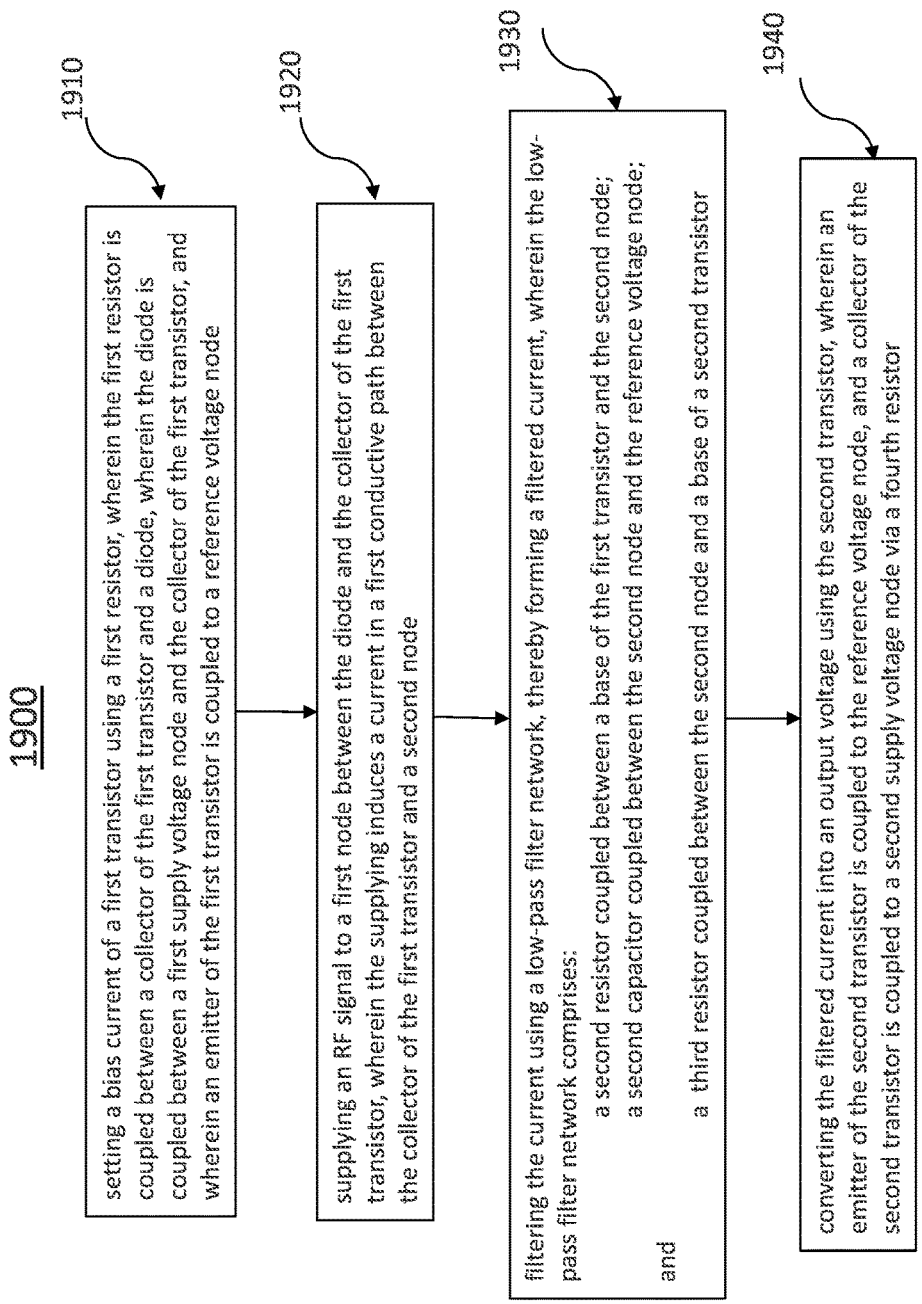
FIG. 19 is a flow chart of a method for operating an RF circuit, in some embodiments.

FIG. 19 illustrates a flow chart of a method of operating a radio frequency circuit, in accordance with some embodiments. It should be understood that the embodiment method shown in FIG. 19 is an example of many possible embodiment methods. One of ordinary skill in the art would recognize many variations, alternatives, and modifications. For example, various steps as illustrated in FIG. 19 may be added, removed, replaced, rearranged and repeated.

Referring to FIG. 19, at step 1910, a bias current of a first transistor is set using a first resistor, where the first resistor is coupled between a collector of the first transistor and a diode, where the diode is coupled between a first supply voltage node and the collector of the first transistor, and where an emitter of the first transistor is coupled to a reference voltage node. At step 1920, an RF signal is supplied to a first node between the diode and the collector of the first transistor, where the supplying induces a current in a first conductive path between the collector of the first transistor and a second node. At step 1930, the current is filtered using a low-pass filter network, thereby forming a filtered current. The low-pass filter network includes a second resistor coupled between a base of the first transistor and the second node, a second capacitor coupled between the second node and the reference voltage node, and a third resistor coupled between the second node and a base of a second transistor. At step 1940, the filtered current is converted into an output voltage using the second transistor, where an emitter of the second transistor is coupled to the reference voltage node, and a collector of the second transistor is coupled to a second supply voltage node via a fourth resistor.

Embodiments of the present invention are summarized here. Other embodiments can also be understood form the entirety of the specification and the claims filed herein. One general aspect includes a radio frequency (RF) power detector including a first circuit having a first rectifying diode with a first terminal coupled to a first power supply voltage node. The first circuit also includes an input terminal coupled to a second terminal of the first rectifying diode, a first transistor having a first collector coupled to the second terminal of the first rectifying diode and a first emitter coupled to a reference voltage node, and a second transistor having a second emitter coupled to the reference voltage node and a second collector coupled to a second power supply voltage node. The first circuit further includes a low-pass filter network coupled between a first base of the first collector and a second base of the second transistor, and a first output terminal coupled to the second collector of the second transistor.

Implementations may include one or more of the following features. The the first circuit of the RF power detector further includes a first resistor coupled between the first collector of the first transistor and the second terminal of the first rectifying diode, in some embodiments. The first circuit further includes a first capacitor coupled between the input terminal and the second terminal of the first rectifying diode, in some embodiments. In accordance with an embodiment, the first low-pass filter network includes a second resistor coupled between the first base of the first transistor and a first node, a third resistor coupled between the first node and the second base of the second transistor, and a second capacitor coupled between the first node and the reference voltage node, where the first collector of the first transistor is coupled to the first node. The first circuit further includes a fourth resistor coupled between the second collector of the second transistor and the second power supply voltage node, in some embodiments. A resistance of the first resistor is between about 100 ohm (Ω) to about 500Ω, and a resistance of the fourth resistor is between about 800Ω to about 1000Ω, in various embodiments. A mirror ratio between the second transistor and the first transistor is between about 2 and about 9, in some embodiments.

In some embodiments, the first rectifying diode is a third transistor, where a base of the third transistor is coupled to a collector of the third transistor, where an emitter of the third transistor is coupled to the first capacitor. The RF power detector may further includes a first reference circuit, where the first reference circuit includes a second rectifying diode including a third terminal coupled to the first power supply voltage node. The first reference circuit may also include a third transistor including a third collector coupled to a fourth terminal of the second rectifying diode, and a third emitter coupled to the reference voltage node. The first reference circuit also includes a fourth transistor including a fourth emitter coupled to the reference voltage node, and a fourth collector coupled to the second power supply voltage node. The first reference circuit may further include a second low-pass filter network coupled between a third base of the third transistor and a fourth base of the fourth transistor, and a second output terminal coupled to the fourth collector of the fourth transistor, where the first output terminal and the second output terminal form a pair of differential output terminals.

The first reference circuit may further include a fifth resistor coupled between the second rectifying diode and the third collector of the third resistor. The second low-pass filter network may include a sixth resistor coupled between the third base of the third transistor and a second node, and a seven resistor coupled between the second node and the fourth base of the fourth transistor, where the third collector of the third transistor is coupled to the second node. The first reference circuit may further include an eight resistor coupled between the fourth collector of the fourth transistor and the second power supply voltage node. The power detector may further include a power supply circuit configured to provide a voltage to the first power supply voltage node, where the power supply circuit is configured to change the voltage in accordance with environment temperature to reduce temperature-induced variations in output voltages of the power detector.

Another general aspect includes a radio frequency (RF) circuit including a first circuit having a first transistor with a first emitter coupled to a reference voltage node, a first collector coupled to a supply voltage node, and a first base coupled to an input terminal. The first circuit also includes a first biasing circuit coupled to the first transistor, where the first biasing circuit includes a second transistor including a second collector coupled to the supply voltage node via a second resistor, a second emitter coupled to the reference voltage node, and a second base coupled to the first base of the first transistor. The first circuit further includes a first output terminal coupled to the first collector of the first transistor.

Implementations may include one or more of the following features. The first circuit may further include a first capacitor coupled between the input terminal and the first base of the first transistor. The first circuit may further include a first resistor coupled between the supply voltage node and the first collector of the first transistor. A resistance of the first resistor may be between about 1 kilo-ohm (kΩ) and about 10 kΩ.

In some embodiments, the first circuit further includes a third resistor coupled between a second base of the second transistor and a first node, and a fourth resistor coupled between the first node and the first base of the first transistor, where the second collector of the second transistor is coupled to the first node. The first output terminal is coupled to the first collector of the first transistor via a low-pass filter network, in some embodiments. The low-pass filter network includes a fifth resistor coupled between the first output terminal and the first collector of the first transistor, and a second capacitor coupled between the first output terminal and the reference voltage node, in accordance with an embodiment.

The RF circuit may further include a reference circuit, where the reference circuit includes a third transistor including a third collector coupled to the supply voltage node via a sixth resistor, and a third emitter coupled to the reference voltage node, a second biasing circuit coupled to a third base of the third transistor, and a second output terminal coupled to the third collector of the third transistor, where the first output terminal and the second output terminal form a pair of differential outputs. The second biasing circuit includes a fourth transistor including a fourth emitter coupled to the reference voltage node, a fourth collector coupled to the supply voltage node, and a fourth base coupled to the third base of the third transistor. The reference circuit may further include a seventh resistor coupled between the third base of the third resistor and a second node, and an eighth resistor coupled between the second node and a fourth base of the fourth transistor, where the fourth collector of the fourth transistor is coupled to the second node.

A further general aspect includes a method of operating a radio-frequency (RF) circuit. The method includes setting a bias current of a first transistor using a first resistor, where the first resistor is coupled between a collector of the first transistor and a diode, where the diode is coupled between a first supply voltage node and the collector of the first transistor, and where an emitter of the first transistor is coupled to a reference voltage node. The method also includes supplying a first RF signal to a first node between the diode and the collector of the first transistor, where the supplying induces a current in a first conductive path between the collector of the first transistor and a second node. The method further includes filtering the current using a low-pass filter network, thereby forming a filtered current, where the low-pass filter network includes a second resistor coupled between a base of the first transistor and the second node, a second capacitor coupled between the second node and the reference voltage node, and a third resistor coupled between the second node and a base of a second transistor. The method further includes converting the filtered current into an output voltage using the second transistor, where an emitter of the second transistor is coupled to the reference voltage node, and a collector of the second transistor is coupled to a second supply voltage node via a fourth resistor.

Implementations may include one or more of the following features. In some embodiments, the converting includes amplifying the filtered current using the second transistor, thereby forming an amplified current through the fourth resistor, causing a voltage drop across the fourth resistor due to the amplified current, and providing an output voltage at the collector of the second transistor. The method further includes adjusting a voltage at the first supply voltage node in accordance with a temperature of the RF circuit to reduce temperature-induced variations in the output voltage, in some embodiments. The supplying the first RF signal includes supplying a second RF signal to an input port of a directional coupler, and coupling a first one of a forward-coupled port and a reverse-coupled port of the directional coupler to a first terminal of a matching circuit, where the matching circuit comprises a fifth resistor and a transmission line coupled in series, where a second terminal of the matching circuit outputs the first RF signal, in some embodiments. The supplying the first RF signal further includes coupling the second terminal of the matching circuit to the first node via a first capacitor, in some embodiments.

In yet another general aspect, a method of measuring a radio frequency (RF) signal includes supplying the RF signal to an input port of a coupler, and providing, by the coupler, an output signal at a coupled port or an isolated port of the coupler to an input terminal of an RF power detector, where a termination load is coupled between a reference voltage node and the coupled port or the isolated port. The RF power detector includes a first transistor including a first emitter coupled to the reference voltage node, a first collector coupled to a supply voltage node via a first resistor, and a first base coupled to the input terminal. The RF power detector also includes a first biasing circuit coupled to the first transistor, where the first biasing circuit includes a second transistor including a second collector coupled to the supply voltage node via a second resistor, a second emitter coupled to the reference voltage node, and a second base coupled to the first base of the first transistor, and an output terminal coupled to the first collector of the first transistor. The method further includes measuring a voltage at the output terminal of the RF power detector.

Implementations may include one or more of the following features. In some embodiments, the RF power detector further includes a third resistor and a fourth resistor coupled in series between the first base of the first transistor and the second base of the second transistor, where the second collector of the second transistor is coupled to a node between the third resistor and the fourth resistor. In some embodiments, the RF power detector further includes a low-pass filter network coupled between the first collector of the first transistor and the output terminal.

Advantages of embodiments of the present invention include good impedance matching over a wide frequency range (e.g., from 57 GHz to 64 GHz). Different frequency ranges can be supported by tuning the parameters of the components of the RF power detectors. The presently disclosed RF power detectors achieves good sensitivity with little de-tuning, and could be used without an operational amplifier, which is well-suited for implementation in ICs. For example, RF power detectors 1000 and 1100 (see FIGS. 10 and 11) can be terminated by a resistor, and no transmission line or inductance is needed for termination, this allows for a compact layout in IC design. By using a reference circuit, differential outputs can be provided to compensate for process variations and/or power supply voltage drift. The RF power detectors disclosed in the present disclosure are either robust to temperature change (e.g., RF power detectors 1000 and 1100), or can be supplied with a voltage that changes in accordance with temperature (e.g., RF power detectors 200 and 300) to compensate for temperature change, thus providing stable output voltages that are robust to temperature changes.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:
1. A radio frequency (RF) power detector comprising:
 a first circuit comprising:
  a first rectifying diode comprising a first terminal coupled to a first power supply voltage node;
  an input terminal coupled to a second terminal of the first rectifying diode;
  a first transistor comprising a first collector coupled to the second terminal of the first rectifying diode, and a first emitter coupled to a reference voltage node;
  a second transistor comprising a second emitter coupled to the reference voltage node, and a second collector coupled to a second power supply voltage node;
  a low-pass filter network coupled between a first base of the first transistor and a second base of the second transistor; and
  a first output terminal coupled to the second collector of the second transistor.

2. The RF power detector of claim 1, wherein the first circuit further comprises a first resistor coupled between the first collector of the first transistor and the second terminal of the first rectifying diode.

3. The RF power detector of claim 2, wherein the first circuit further comprises a first capacitor coupled between the input terminal and the second terminal of the first rectifying diode.

4. The RF power detector of claim 3, wherein the low-pass filter network comprises:
a second resistor coupled between the first base of the first transistor and a first node;
a third resistor coupled between the first node and the second base of the second transistor; and
a second capacitor coupled between the first node and the reference voltage node,
wherein the first collector of the first transistor is coupled to the first node.

5. The RF power detector of claim 4, wherein the first circuit further comprises a fourth resistor coupled between the second collector of the second transistor and the second power supply voltage node.

6. The RF power detector of claim 5, wherein the first rectifying diode is a third transistor, wherein a base of the third transistor is coupled to a collector of the third transistor, wherein an emitter of the third transistor is coupled to the first capacitor.

7. The RF power detector of claim 5, further comprising a first reference circuit, wherein the first reference circuit comprises:
a second rectifying diode comprising a third terminal coupled to the first power supply voltage node;
a third transistor comprising a third collector coupled to a fourth terminal of the second rectifying diode, and a third emitter coupled to the reference voltage node;
a fourth transistor comprising a fourth emitter coupled to the reference voltage node, and a fourth collector coupled to the second power supply voltage node;
a second low-pass filter network coupled between a third base of the third transistor and a fourth base of the fourth transistor; and
a second output terminal coupled to the fourth collector of the fourth transistor,
wherein the first output terminal and the second output terminal form a pair of differential output terminals.

8. The RF power detector of claim 7, wherein the first reference circuit further comprises a fifth resistor coupled between the second rectifying diode and the third collector of the third resistor.

9. The RF power detector of claim 7, wherein second low-pass filter network comprises:
a sixth resistor coupled between the third base of the third transistor and a second node; and
a seven resistor coupled between the second node and the fourth base of the fourth transistor,
wherein the third collector of the third transistor is coupled to the second node.

10. The RF power detector of claim 9, wherein the first reference circuit further comprises an eight resistor coupled between the fourth collector of the fourth transistor and the second power supply voltage node.

11. The RF power detector of claim 10, further comprising a power supply circuit configured to provide a voltage to the first power supply voltage node, wherein the power supply circuit is configured to change the voltage in accordance with environment temperature to reduce temperature-induced variations in output voltages of the power detector.

12. A radio frequency (RF) circuit comprising:
a first circuit comprising:
a first transistor comprising a first emitter coupled to a reference voltage node, a first collector coupled to a first supply voltage node through a first resistor, and a first base coupled to an input terminal, wherein the first emitter has a same voltage as the reference voltage node, wherein a first terminal of the first resistor is coupled to and has a same voltage as the first supply voltage node, and a second terminal of the first resistor is coupled to and has a same voltage as the first collector;
a first biasing circuit coupled to the first transistor, wherein the first biasing circuit comprises:
a second transistor comprising a second collector coupled to a second supply voltage node via a second resistor, a second emitter coupled to the reference voltage node, and a second base coupled to the first base of the first transistor, wherein the second resistor is a fixed resistor, a first terminal of the second resistor is coupled to and has a same voltage as the second supply voltage node, and a second terminal of the second resistor is coupled to and has same voltage as the second collector, wherein the second collector is coupled to and has the same voltage as a first node between the first base and the second base;
a third resistor coupled between the first node and the first base;
a fourth resistor coupled between the first node and the second base; and
a first output terminal coupled to the first collector of the first transistor.

13. The RF circuit of claim 12, wherein the first circuit further comprises a first capacitor coupled between the input terminal and the first base of the first transistor.

14. The RF circuit of claim 12, wherein the first output terminal is coupled to the first collector of the first transistor via a low-pass filter network.

15. The RF circuit of claim 14, wherein the low-pass filter network comprises:
a fifth resistor coupled between the first output terminal and the first collector of the first transistor; and
a second capacitor coupled between the first output terminal and the reference voltage node.

16. The RF circuit of claim 15, further comprising a reference circuit, wherein the reference circuit comprises:
a third transistor comprising a third collector coupled to a third supply voltage node via a sixth resistor, and a third emitter coupled to the reference voltage node;
a second biasing circuit coupled to a third base of the third transistor; and
a second output terminal coupled to the third collector of the third transistor,
wherein the first output terminal and the second output terminal form a pair of differential outputs.

17. The RF circuit of claim 16, wherein the second biasing circuit comprises:
a fourth transistor comprising a fourth emitter coupled to the reference voltage node, a fourth collector coupled to a fourth supply voltage node, and a fourth base coupled to the third base of the third transistor.

18. The RF circuit of claim 17, wherein the reference circuit further comprises:
a seventh resistor coupled between the third base of the third transistor and a second node; and an eighth resistor coupled between the second node and a fourth base of the fourth transistor,
wherein the fourth collector of the fourth transistor is coupled to the second node.

19. A method of operating a radio-frequency (RF) circuit, the method comprising:
setting a bias current of a first transistor using a first resistor, wherein the first resistor is coupled between a collector of the first transistor and a diode, wherein the diode is coupled between a first supply voltage node and the collector of the first transistor, and wherein an emitter of the first transistor is coupled to a reference voltage node;
supplying a first RF signal to a first node between the diode and the collector of the first transistor, wherein the supplying induces a current in a first conductive path between the collector of the first transistor and a second node;
filtering the current using a low-pass filter network, thereby forming a filtered current, wherein the low-pass filter network comprises:
a second resistor coupled between a base of the first transistor and the second node;
a second capacitor coupled between the second node and the reference voltage node; and
a third resistor coupled between the second node and a base of a second transistor; and
converting the filtered current into an output voltage using the second transistor, wherein an emitter of the second transistor is coupled to the reference voltage node, and a collector of the second transistor is coupled to a second supply voltage node via a fourth resistor.

20. The method of claim 19, wherein the converting comprises:
amplifying the filtered current using the second transistor, thereby forming an amplified current through the fourth resistor;
causing a voltage drop across the fourth resistor due to the amplified current; and
providing an output voltage at the collector of the second transistor.

21. The method of claim 20, wherein the supplying the first RF signal comprises:
supplying a second RF signal to an input port of a directional coupler;
coupling a first one of a forward-coupled port and a reverse-coupled port of the directional coupler to a first terminal of a matching circuit, wherein the matching circuit comprises a fifth resistor and a transmission line coupled in series, wherein a second terminal of the matching circuit outputs the first RF signal; and
coupling the second terminal of the matching circuit to the first node via a first capacitor.

22. A method of measuring a radio frequency (RF) signal, the method comprising:
supplying the RF signal to an input port of a coupler;
providing, by the coupler, an output signal at a coupled port or an isolated port of the coupler to an input terminal of an RF power detector, wherein a termination load is coupled between a reference voltage node and the coupled port or the isolated port, wherein the RF power detector comprises:
a first transistor comprising a first emitter coupled to the reference voltage node, a first collector coupled to a supply voltage node via a first resistor, and a first base coupled to the input terminal;
a first biasing circuit coupled to the first transistor, wherein the first biasing circuit comprises a second transistor comprising a second collector coupled to the supply voltage node via a second resistor, a second emitter coupled to the reference voltage node, and a second base coupled to the first base of the first transistor; and
an output terminal coupled to the first collector of the first transistor; and
measuring a voltage at the output terminal of the RF power detector.

23. The method of claim 22, wherein the RF power detector further comprises:
a third resistor and a fourth resistor coupled in series between the first base of the first transistor and the second base of the second transistor, wherein the second collector of the second transistor is coupled to a node between the third resistor and the fourth resistor.

* * * * *